(12) United States Patent
Yamauchi et al.

(10) Patent No.: US 6,284,587 B1
(45) Date of Patent: Sep. 4, 2001

(54) FABRICATING METHOD FOR SEMICONDUCTOR DEVICE

(75) Inventors: Satoshi Yamauchi; Shinobu Takehiro; Masaki Yoshimaru, all of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/081,567

(22) Filed: May 19, 1998

(30) Foreign Application Priority Data

Oct. 27, 1997 (JP) ................................... 9-294502

(51) Int. Cl.$^7$ ............................................... H01L 21/8242
(52) U.S. Cl. .......................... 438/240; 438/396; 438/502; 438/800
(58) Field of Search ..................... 438/396, 399, 438/502, 573, 580, 582, 562, 763, 764, 800

(56) References Cited

U.S. PATENT DOCUMENTS 4,521,951 * 6/1985 Croset et al. ........................ 438/393

FOREIGN PATENT DOCUMENTS

| 04171975a | * | 6/1992 | (JP). |
| 08330512a | * | 5/1995 | (JP). |
| 9-82915 | | 3/1997 | (JP). |

* cited by examiner

*Primary Examiner*—Eddie Lee
*Assistant Examiner*—Paul E Brock, II
(74) *Attorney, Agent, or Firm*—Jones Volentine, PLLC

(57) ABSTRACT

In the fabrication of capacitors, a TiO$_2$ film is formed from a TiN film by means of heat-treatment within an atmosphere which does not contain oxygen. This serves to prevent the polysilicon which forms the bottom electrode from being oxidized during heat-treatment. Thus, once the bottom electrode has been formed on the silicon wafer, a TiN film and RuO$_2$ film are formed, and the silicon wafer is heat-treated in an atmosphere which does not contain oxygen. In this manner, a dielectric film that is a TiO$_2$ film and a top electrode that is a ruthenium film are obtained.

27 Claims, 16 Drawing Sheets

FABRICATING METHOD FOR SEMICONDUCTOR DEVICE

BACKGROUND TO THE INVENTION

1. Field of the Invention

The present invention relates to a fabricating method for capacitor of a semiconductor device.

2. Description of the Related Art

The conventional method of building a capacitor into a semiconductor device has involved forming a dielectric film in the shape of a tantalum oxide, barium-strontium titanate or other oxide film on to a bottom electrode of polysilicon, metal or oxide conductive layer, then forming a top electrode of ruthenium, iridium or a similar substance.

When fabricating capacitors of this sort it is common to implement heat-treatment within oxygen, activated oxygen or ozone after formation of the dielectric film. This serves to increase dielectric constant by crystallizing the dielectric film, and to reduce current leakage by compensating oxygen deficit (cf. Japanese Laid-Open Publication No.82915/97).

FIG. 16 is cross-section illustrating an example of the configuration of a conventional semiconductor device.

As FIG. 16 shows, a device isolating silicon oxide film 1602 and a diffusion layer 1603 forming part of a MOS transistor or a similar device are formed on the surface of a silicon wafer 1601, followed by an interlayer insulator 1604. Then, after a contact hole 1605 has been formed in the film 1604, a bottom electrode 1606 is formed in the shape of an interlayer wiring film 1606a and conductive layer 1606b in polysilicon or a similar substance. Next, a tantalum oxide or other dielectric film 1607 is formed over the whole surface, and the capacitor is heat-treated in oxygen, activated oxygen or ozone as mentioned above. Finally, it is completed with the formation of a top electrode 1608 having a film of ruthenium, iridium or a similar substance which covers all the film 1607.

However, conventional capacitors such as those illustrated in FIG. 16 suffer from the following defects.

As has been stated above, it has been common conventional practice to subject the capacitor to heat-treatment in an atmosphere of oxygen or the like after formation of the film 1607. As a result it sometimes happens that a silicon oxide layer 1606c is formed in the vicinity of the interfacial boundary between the films 1606a and 1606b. This leads to the formation, in addition to the above mentioned capacitor, of another capacitor comprising the conductive films 1606a and 1606b along with the insulation layer 1606c, so that two serially connected capacitors exist within the semiconductor device. Consequently, the total dielectric constant of the capacitors formed in such a semiconductor device falls below the intended level.

Moreover, it sometimes happens that during heat-treatment the layer 1606b oxidizes, thereby tending to increase the unevenness of the surface and resultant current leakage.

Conversely, the oxygen within the film 1607 may be released during heat-treatment, leading to oxygen deficit and consequent increased current leakage.

If the conductive layer 1606b is formed of a different material such as a metal or a conductive oxide, it may happen that a barrier layer (not shown in the drawing) forms between the films 1606b and 1606c. In such cases, heat-treatment causes this barrier layer to oxidize into a dielectric layer, so that there is a risk of a capacitor being formed between the layers 1606b and 1606a. The result again is that the total dielectric constant of the capacitors falls below the intended level.

Such defects combine to lower the yield of the semiconductor device, and result in increased costs.

SUMMARY OF THE INVENTION

It is an object of the present invention to provide a fabricating method for a semiconductor device whereby it is possible to prevent reduced yield caused during heat-treatment.

The fabricating method of a semiconductor device to which the present invention pertains comprises forming a laminated structure, having at least a first film for use in forming an oxidized dielectric film which contains an oxidizable substance for the purpose of forming an oxidized dielectric film, and a second film for use in supplying oxygen to said first film; and supplying oxygen from said second film to said first film by virtue of heat-treatment of said laminated structure within an atmosphere which does not contain oxygen.

The present invention allows the film for use in forming an oxidized dielectric film to oxidize as a result of heat-treatment within an atmosphere which does not contain oxygen.

BRIEF DESCRIPTION OF THE DRAWINGS

The other objects and advantages of the present invention will be explained with reference to the following drawings, wherein.

DESCRIPTION OF THE PREFERRED EMBODIMENTS

Figure 1A:
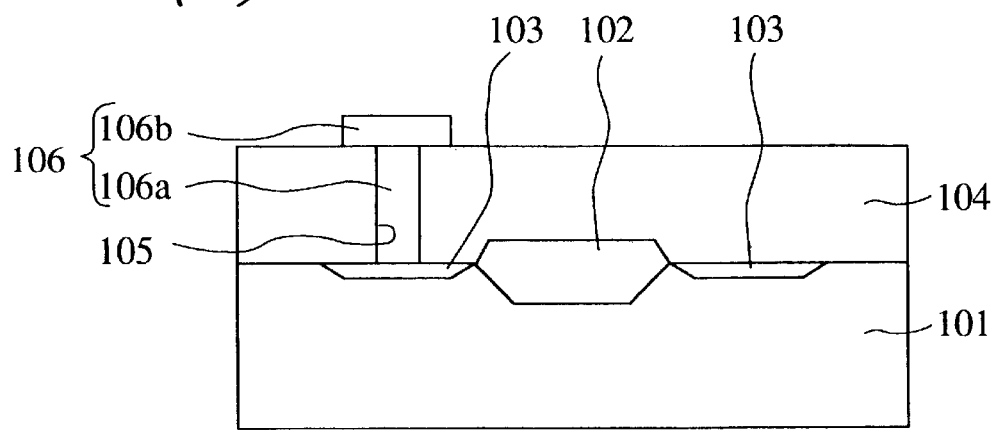
FIGS. 1(A)–1(C) consist of cross-sectional process drawings which serve to explain the fabricating method for a semiconductor device to which the first embodiment pertains.

There follow several embodiments whereby the present invention will be described with reference to the drawings. In the drawings it should be understood that the size, shape and location of the various constituent parts are represented in abbreviated form insofar as it is possible thereby to facilitate an understanding of the present invention, and that the values given in the course of the explanation which follows are only in the nature of examples.

First Embodiment

Firstly, the fabricating method for the semiconductor device to which the first embodiment of the present invention pertains will be explained with reference to FIGS. 1 and 2.

FIG. 1 consists of cross-sectional process drawings which serve to explain the fabricating method for a semiconductor device to which the first embodiment pertains.

(1) First of all, a device isolation $SiO_2$ film 102 and a diffusion layer 103 forming part of a MOS transistor or a similar device are formed on the surface of a silicon wafer 101.

(2) Next, an interlayer insulating film 104 with a thickness of, for instance, 700–1000 nm is formed over the whole surface of the wafer 101 by chemical vapor deposition (CVD) or a similar method.

(3) Following this, photolithography or another regular method is used to form a contact hole 105 in this film 104.

(4) The next step involves depositing polysilicon to a thickness of, for instance, 20–100 nm over the whole surface by sputtering or a similar technique. A bottom electrode 106 having an interlayer wiring film 106a and a conductive layer 106b is then formed by patterning with the aid of photolithography or another regular method (cf. FIG. 1(A)).

(5) After that, sputtering, CVD or a similar technique is employed to form a TiN film 107 to a thickness of, for instance, 10–100 nm over the whole surface for use in forming an oxidized dielectric film.

Figure 1B:
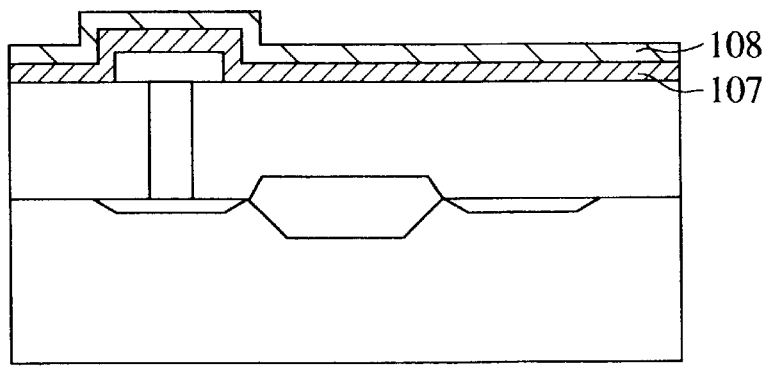
Figure 1C:
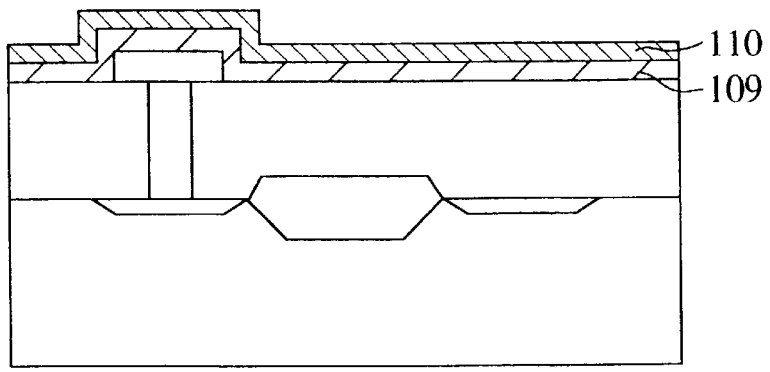

(6) Next, sputtering, CVD or a similar technique is again employed to form a $RuO_2$ film 108 to a thickness of, for instance, 50–200 nm over the whole surface of the TiN film 107 for use in supplying oxygen (cf. FIG. 1(B)).

(7) Finally, heat-treatment is implemented by rapid thermal anneal (RTA) or a similar method, for instance, for 3 min at 600° C. within an atmosphere not containing oxygen (e.g. an atmosphere of $N_2$, He, Ar, Xe or a similar gas). This causes the oxygen within the $RuO_2$ film 108 to be supplied to the TiN film 107, allowing an oxidized dielectric $TiO_2$ film 109 to be produced (cf. FIG. 1(C)). At the same time, the $RuO_2$ film 108 loses its oxygen and becomes a Ru film 110, which is used as a top electrode in the completed capacitor.

Figure 2:
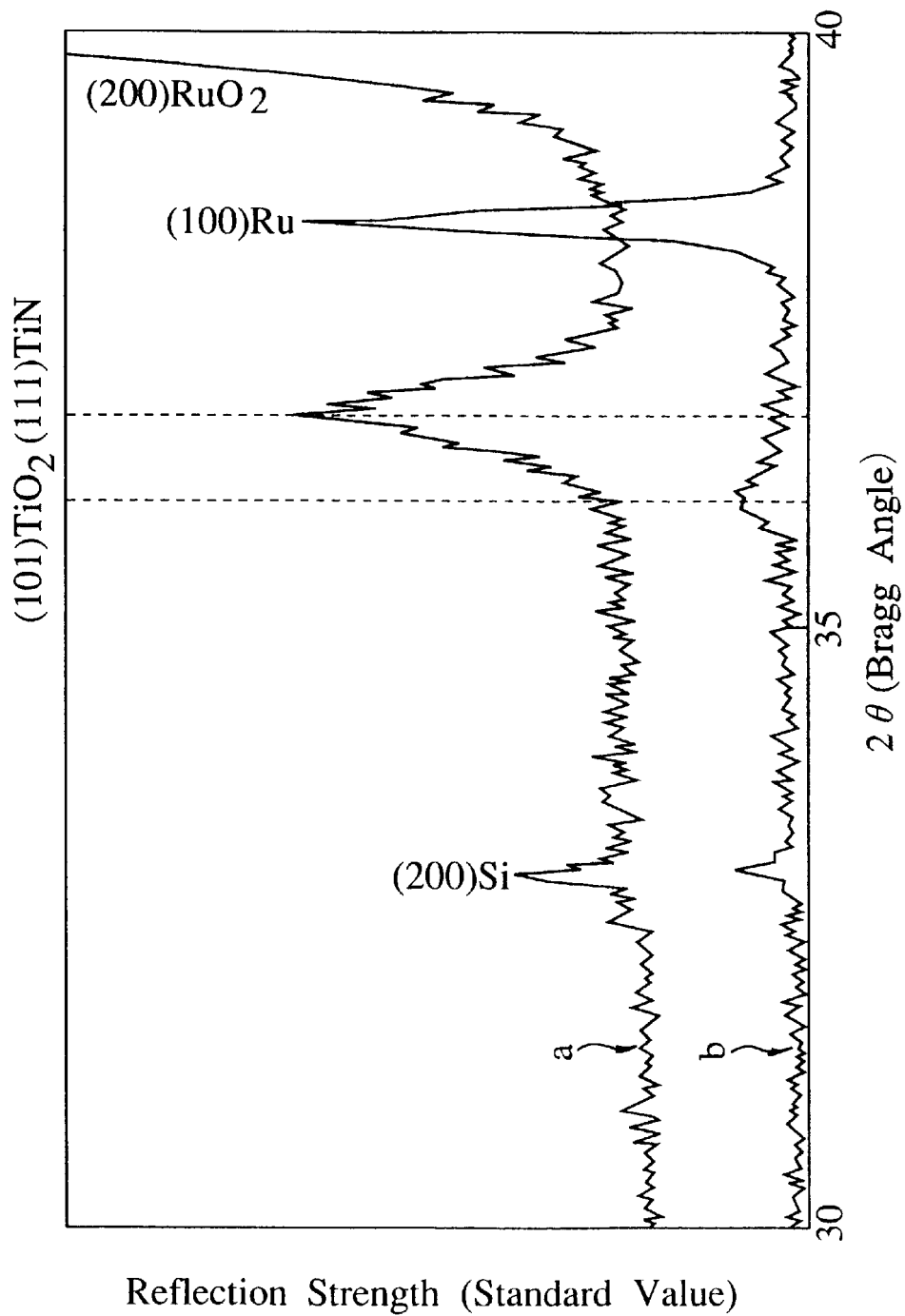
FIG. 2 shows the X-ray analysis pattern when the composition of the capacitor to which the first embodiment pertains was analyzed.

FIG. 2 shows the X-ray analysis pattern when the composition of the capacitor to which the first embodiment pertains was analyzed. In FIG. 2, the vertical axis represents the reflection strength (standard value), and the horizontal axis the Bragg angle 2θ.

As the code a in FIG. 2 demonstrates, diffraction peaks of TiN and $RuO_2$ were detected before heat-treatment (process 7) was implemented. Meanwhile, diffraction peaks of $TiO_2$ and Ru were detected after heat-treatment was implemented, as the code b shows. This permitted confirmation of the changes of the TiN film 107 and $RuO_2$ film 108 into the $TiO_2$ film 109 and Ru film 110 respectively as a result of heat-treatment.

Thus, the fabricating method for a semiconductor device to which the present embodiment pertains facilitates the formation of the $TiO_2$ film 109 though heat-treatment in an atmosphere which does not contain oxygen. This makes it possible to inhibit oxidation of the polysilicon with which the bottom electrode 106 is formed.

Consequently, the present embodiment serves to prevent lowering of the dielectric constant as a result of the formation of a $SiO_2$ film in the vicinity of the interfacial boundary between the interlayer wiring film 106a and the conductive layer 106b, together with increased current leakage resulting from unevenness due to oxidation of the conductive layer 106b. As a result, the yield of the semiconductor device increases.

Meanwhile, it is TiN rather than Ti which accumulates on the conductive layer 106b, thus preventing the formation of titanium silicide and helping to increase yield.

It should be noted that in the description of the present embodiment it has been assumed that the film for use in the formation of an oxidized dielectric film is the TiN film 107, but it is also possible to use other nitrides such as TaN, ZrN and HfN.

In the same manner, the $RuO_2$ film 108 has been employed as the film for use in supplying oxygen, but all that is required is that this film for use in supplying oxygen be an oxide conductor which is thermally less stable than the substance which forms the oxidized dielectric film, and it is also possible to utilize an $IrO_2$ film, or one which consists of a mixture of $RuO_2$ and $IrO_2$.

What is more, instead of the $RuO_2$ film 108 it is possible to use a film with a different oxygen concentration, such as $RuO_x$ (0<X<2), for the purpose of supplying oxygen. Thus, by altering the oxygen concentration of the film for use in supplying oxygen it is possible to control the amount of oxygen supplied to the film for use in forming an oxidized dielectric film, thereby preventing excess supply of oxygen.

Second Embodiment

Figure 3A:
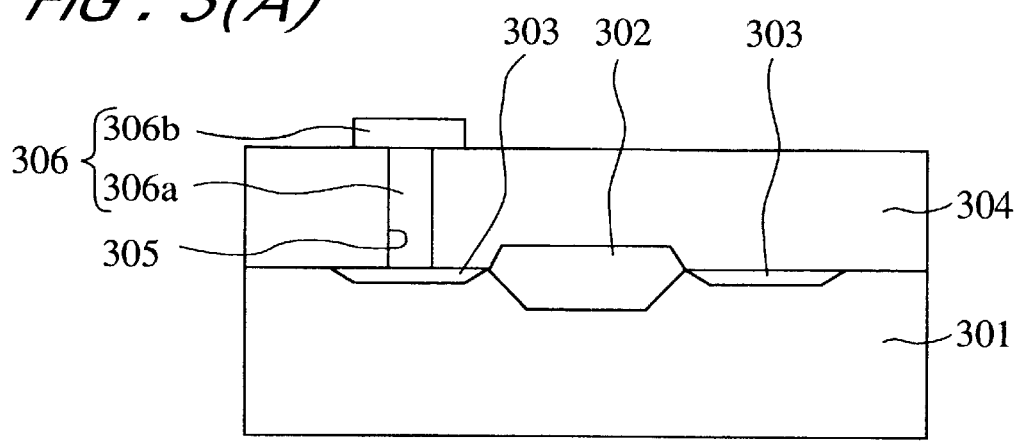
FIGS. 3(A)–3(C) consist of cross-sectional process drawings which serve to explain the fabricating method for a semiconductor device to which the second embodiment pertains.

Next, the fabricating method for the semiconductor device to which the second embodiment of the present invention pertains will be explained with reference to FIGS. 3–5.

FIG. 3 consists of cross-sectional process drawings which serve to explain the fabricating method for a semiconductor device to which the second embodiment pertains.

(1) First of all, as in the first embodiment, a device isolation $SiO_2$ film 302 and a diffusion layer 303 are formed on the surface of a silicon wafer 301. Next, an interlayer insulating film 304 with a thickness of, for instance, 700–1000 nm is formed over the whole surface of the wafer 301 by CVD or a similar method. Following this, photolithography or another regular method is used to form a contact hole 305 in this film 304.

(2) The next step involves depositing polysilicon to a thickness of, for instance, 20–100 nm over the whole surface by sputtering or a similar technique. A bottom electrode 306 having an interlayer wiring film 306a and a conductive layer 306b is then formed by patterning with the aid of photolithography or another regular method (cf. FIG. 3(A)).

(3) After that, sputtering, CVD or a similar technique is employed to form a TiN film 307 to a thickness of, for instance, 10–100 nm over the whole surface for use in forming an oxidized dielectric film.

(4) Next, sputtering, CVD or a similar technique is again employed to form an Ru film 308 to a thickness of, for instance, 10 nm over the whole surface of the TiN film 307 as a metal film.

Here it is preferable that the Ru film 308 be formed in such a manner that tensile stress is impressed on it. This is in order to ensure satisfactory oxygen permeability at a later stage when heat-treatment is implemented (process 7).

Figure 4:
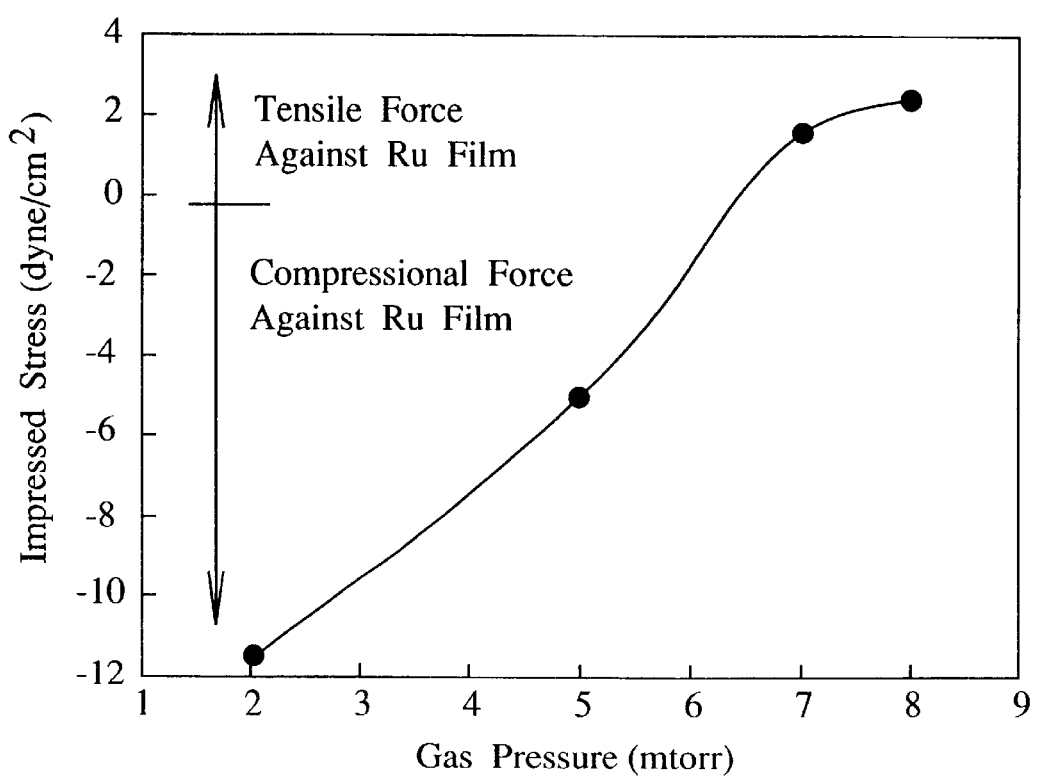
FIG. 4 is a graph illustrating the relationship between the gas pressure during formation of the Ru film and the impressed stress of the Ru film after formation in the semiconductor device to which the second embodiment pertains.

FIG. 4 is a graph illustrating the relationship between the gas pressure during formation of the Ru film and the impressed stress of the Ru film after formation in the semiconductor device to which the second embodiment pertains. In FIG. 4, the vertical axis represents the impressed stress (dyne/cm$^2$), and the horizontal axis the gas pressure (mTorr).

It will be seen from the graph that a gas pressure of, for instance, 6.5 mTorr or greater is required in order to impress tensile force against the Ru film 308.

Figure 3B:
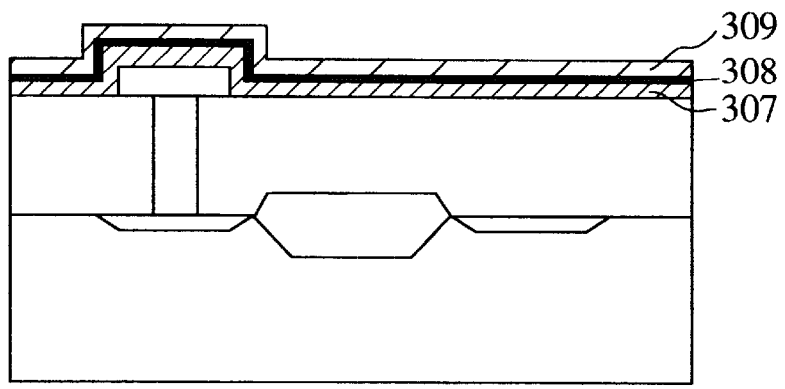
Figure 3C:
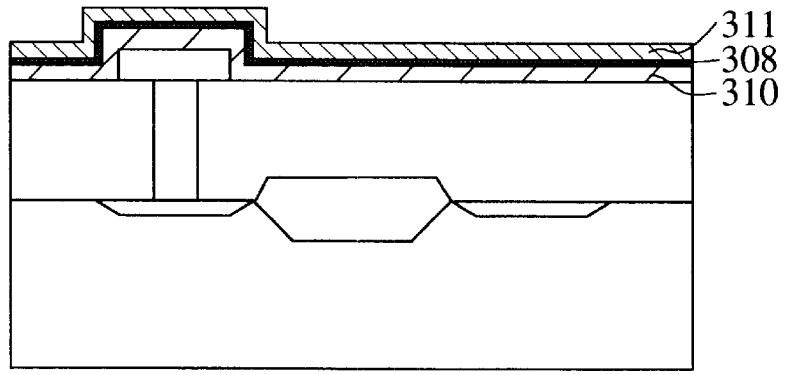

(5) Following this, sputtering, CVD or a similar technique is employed once more to form a $RuO_2$ film 309 to a thickness of, for instance, 50–200 nm over the whole surface of the Ru film 308 as a film for use in supplying oxygen (cf. FIG. 3(B)).

(6) Finally, heat-treatment is implemented by rapid thermal anneal (RTA) or a similar method, for instance, for 3 min at 600° C. within an atmosphere not containing oxygen (e.g. an atmosphere of $N_2$, He, Ar, Xe or a similar gas). This causes the oxygen within the $RuO_2$ film 309 to be activated by the Ru film 308 and supplied to the TiN film 307, allowing an oxidized dielectric $TiO_2$ film 310 to be produced (cf. FIG. 3(C)). At the same time, the $RuO_2$ film 309 loses its oxygen and becomes a Ru film 311, which is used along with the Ru film 308 as a top electrode in the completed capacitor.

Figure 5A:
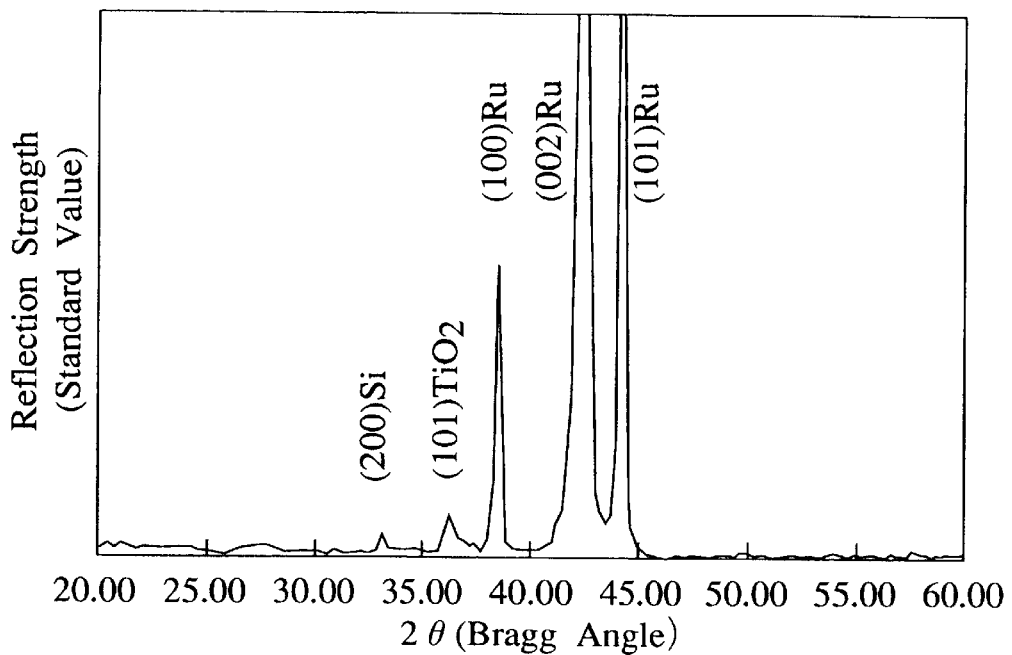
FIGS. 5(A) and 5(B) show the X-ray analysis pattern when the composition of the capacitor to which the second embodiment pertains was analyzed, FIG. 5(A) where the Ru film was formed so that tensile stress would be impressed, and FIG. 5(B) where the Ru film was formed so that compressional stress would be impressed.
Figure 5B:
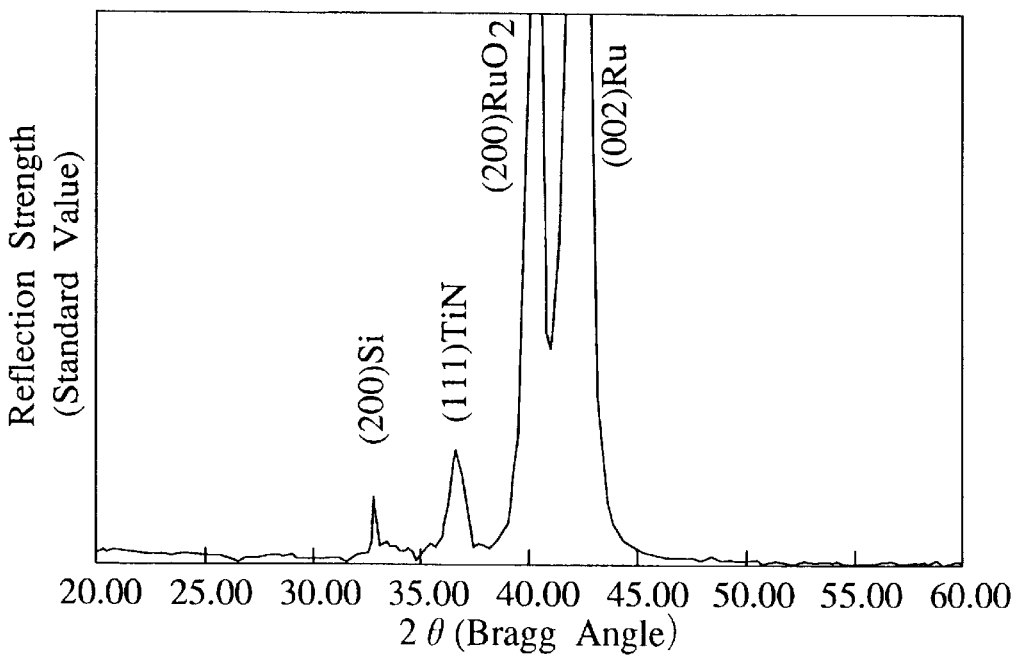

FIG. 5 shows the X-ray analysis pattern when the composition of the capacitor to which the second embodiment pertains was analyzed, FIG. 5(A) where the Ru film 308 was formed so that tensile stress would be impressed, and FIG. 5(B) where the Ru film 308 was formed so that compressional stress would be impressed. In FIG. 5, the vertical axis represents the reflection strength (standard value), and the horizontal axis the Bragg angle 2θ.

As FIG. 5(A) demonstrates, if the Ru film 308 is formed so that tensile stress is impressed, the TiN film 307 changes completely into the $TiO_2$ film 310. On the other hand, there is no oxidation of the TiN film 307 if the Ru film 308 is formed so that compressional stress is impressed.

Because in the present embodiment the Ru film 308 is formed as a metal film between the TiN film 307 and the $RuO_2$ film 309, the catalytic properties of the Ru allow activated oxygen to be supplied to the TiN film 307. Consequently, it is possible to form a high-quality $TiO_2$ film 310 (i.e. a stable film with good binding of titanium and oxygen) in roughly the same heat-treatment time as in the first embodiment (process 6). This is effective in ensuring increased dielectric constant and lower current leakage. Meanwhile, the present invention allows the heat-treatment time to be shortened if the quality of the $TiO_2$ film 310 does not need to be better than that provided by the first embodiment.

The present embodiment is the same as the first embodiment in that heat-treatment within an atmosphere which does not contain oxygen makes it possible to inhibit oxidation of the bottom electrode 306 and to prevent the formation of titanium silicide on the conductive layer 306b.

It should be noted that the Ru film 308 has been employed as a metal film, but other metals such as Ir or Pt may be used provided that they have a catalytic action on oxygen.

The present embodiment is the same as the first embodiment in that it is also possible to use other nitrides such as TaN, ZrN and HfN in the film for use in the formation of an oxidized dielectric film. It is also the same as the first embodiment in that all that is required of the film for use in supplying oxygen is that it be an oxide conductor which is thermally less stable than the substance which forms the oxidized dielectric film, so that it is also possible to utilize an $IrO_2$ film, or one which consists of a mixture of $RuO_2$ and $IrO_2$. Moreover, it is again possible to use a film with a different oxygen concentration.

Third Embodiment

Next, the fabricating method for the semiconductor device to which the third embodiment of the present invention pertains will be explained with reference to FIG. 6.

FIG. 6 consists of cross-sectional process drawings which serve to explain the fabricating method for a semiconductor device to which the third embodiment pertains.

(1) First of all, as in the above embodiments, a device isolation $SiO_2$ film 602 and a diffusion layer 603 are formed on the surface of a silicon wafer 601. Next, an interlayer insulating film 604 with a thickness of, for instance, 700–1000 nm is formed over the whole surface of the wafer 601 by CVD or a similar method. Following this, photolithography or another regular method is used to form a contact hole 605 in this film 604.

Figure 6A:
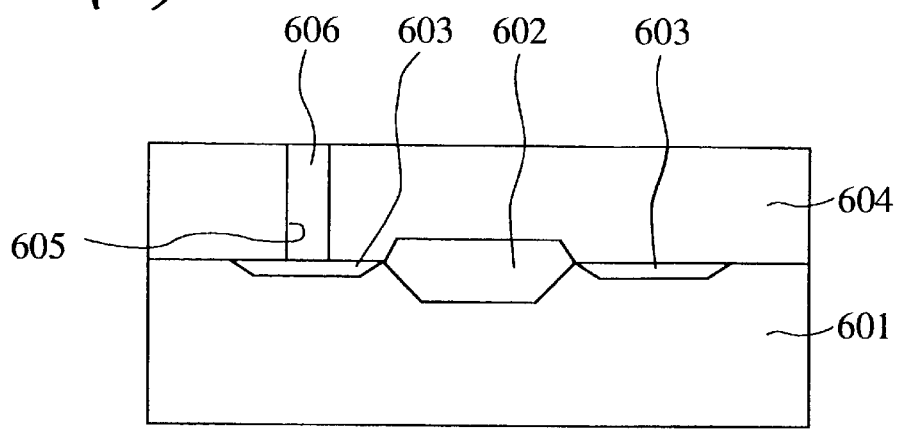
FIGS. 6(A)–6(C) consist of cross-sectional process drawings which serve to explain the fabricating method for a semiconductor device to which the third embodiment pertains.

(2) The next step involves employing, for instance, sputtering to deposit polysilicon over the whole surface, after which an interlayer wiring film 606 is formed by means of etch-back (cf. FIG. 6(A)).

(3) Sputtering, CVD or a similar technique is then employed to form Ti, Ru and $RuO_2$ films in that order, which by virtue of patterning by photolithography or another regular method come to form a Ti barrier layer 607, a Ru metal film 608 and a $RuO_2$ film 609 for use in supplying oxygen. The total thickness of these three films 607–609 may be for instance 50–150 nm, while that of the $RuO_2$ film 609 may be for instance 20–100 nm.

Here it is preferable that the Ru film 608 be formed in such a manner that compressional stress is impressed on it. This is in order to ensure that the Ti film 607 and interlayer wiring film 606 are not oxidized at a later stage when heat-treatment is implemented (process 7) (see below).

It should be added that the films 607–609 and the interlayer wiring film 606 constitute the bottom electrode 610.

(4) Following this, sputtering, CVD or a similar technique is employed again to form a TiN film 611 to a thickness of, for instance, 10–100 nm over the whole surface to form a film for use in forming an oxidized insulator film.

Figure 6B:
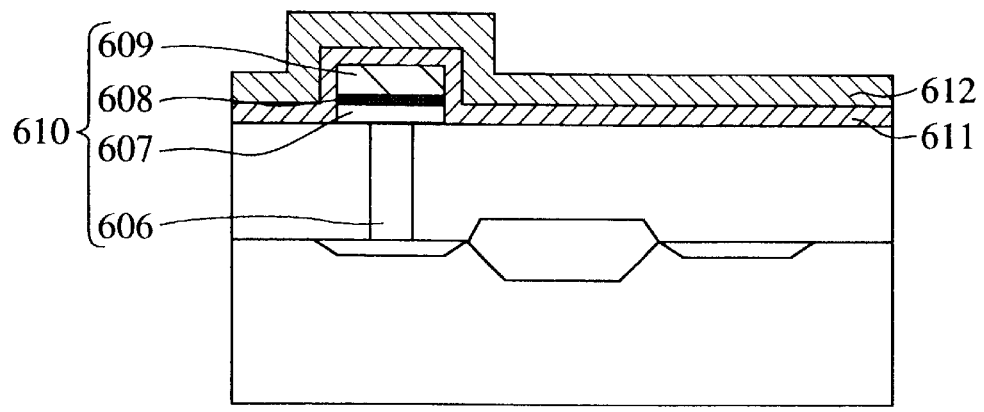
Figure 6C:
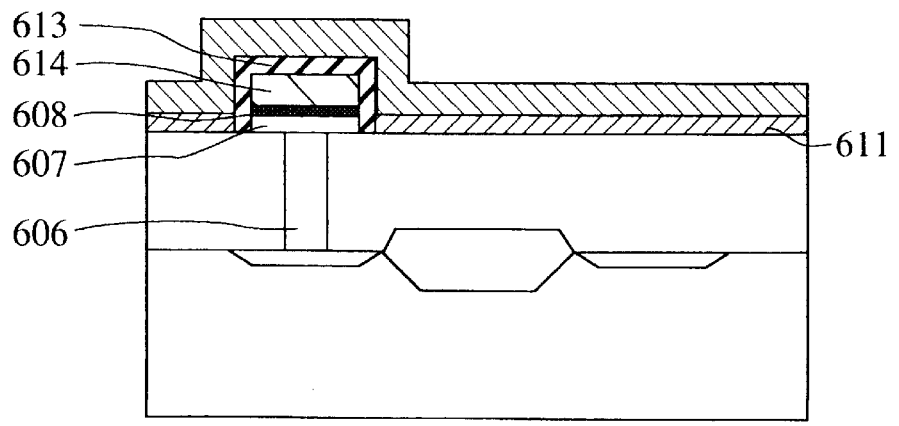

(5) Next, sputtering, CVD or a similar technique is employed once more to form a Ru film 612 to a thickness of, for instance, 50–200 nm over the whole surface of the TiN film 611 to form a top electrode (cf. FIG. 6(B)).

(6) Finally, heat-treatment is implemented by rapid thermal anneal (RTA) or a similar method, for instance, for 3 min at 600° C. within an atmosphere not containing oxygen (e.g. an atmosphere of $N_2$, He, Ar, Xe or a similar gas). This causes the oxygen within the $RuO_2$ film 609 to be supplied to the TiN film 611, allowing an oxidized dielectric $TiO_2$ film 613 to be produced (cf. FIG. 6(C)). At the same time, the $RuO_2$ film 609 loses its oxygen and becomes a Ru film 614.

In this embodiment, as explained above, the Ru film 608 is formed in such a manner that compressional stress is impressed on it. For this reason, as FIG. 4 shows, the Ru film 608 allows scarcely any oxygen to permeate. This makes it possible to prevent oxygen within the $RuO_2$ film 609 from reaching the films 606, 607 etc. below it, thus serving to inhibit oxidation of these films 606, 607 etc.

The fact that in the present embodiment the $RuO_2$ film 609 for use in supplying oxygen and the Ru metal film 608 are located within the bottom electrode 610 means that it is possible to prevent the oxidation of the polysilicon which forms the interlayer wiring film with a greater degree of certainty than is the case in the above embodiments.

Moreover, the fact that the top electrode is formed of Ru from the start allows metal wiring and other subsequent processes to be effected with greater ease than in the above embodiments.

The present embodiment is the same as the above embodiments in that heat-treatment within an atmosphere which does not contain oxygen makes it possible to inhibit oxidation of the bottom electrode 610 and to prevent the formation of titanium silicide.

In the present embodiment, heat-treatment (process 6) has been implemented after the process of forming the Ru film 612 which acts as the top electrode (process 5), but these processes may also be implemented in the opposite order.

In addition, the Ti film 607 has been used as the barrier layer, but it is also possible to use a TiN or Ti/TiN film.

It should be noted that the Ru film 608 has been employed as a metal film, but other metals such as Ir or Pt may be used provided that they have a catalytic action on oxygen.

The present embodiment is the same as the above embodiments in that it is also possible to use other nitrides such as TaN, ZrN and HfN in the film for use in the formation of an oxidized dielectric film.

It is also the same as the above embodiments in that all that is required of the film for use in supplying oxygen is that it be an oxide conductor which is thermally less stable than the substance which forms the oxidized dielectric film, so that it is also possible to utilize an $IrO_2$ film, or one which consists of a mixture of $RuO_2$ and $IrO_2$ Moreover, it is again possible to use a film with a different oxygen concentration.

Fourth Embodiment

Next, the fabricating method for the semiconductor device to which the fourth embodiment of the present invention pertains will be explained with reference to FIG. 7.

Figure 7A:
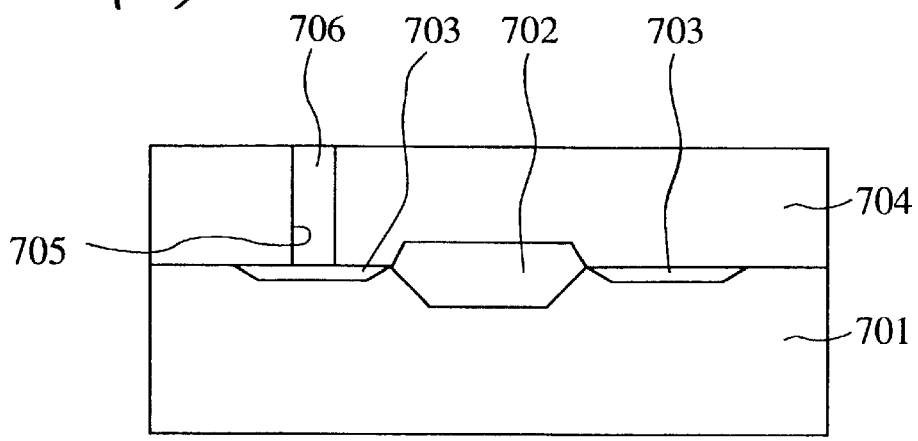
FIGS. 7(A)–7(C) consist of cross-sectional process drawings which serve to explain the fabricating method for a semiconductor device to which the fourth embodiment pertains.
Figure 7B:
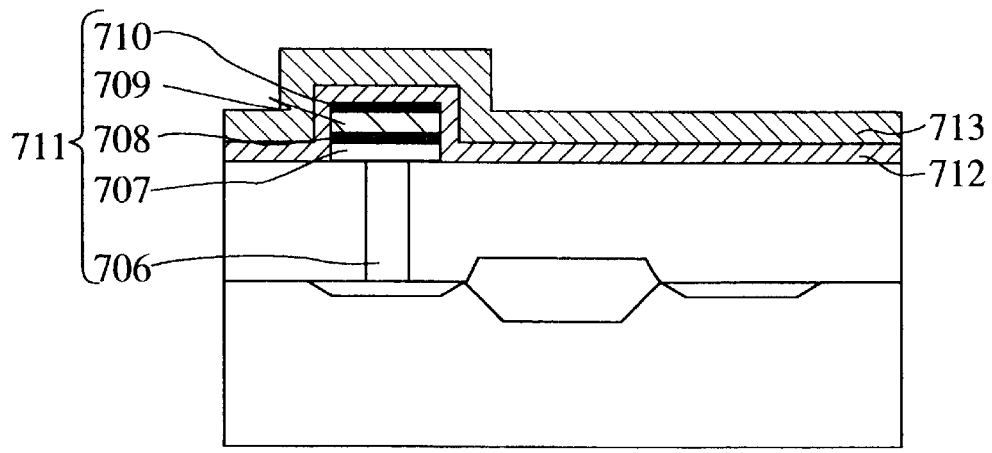
Figure 7C:
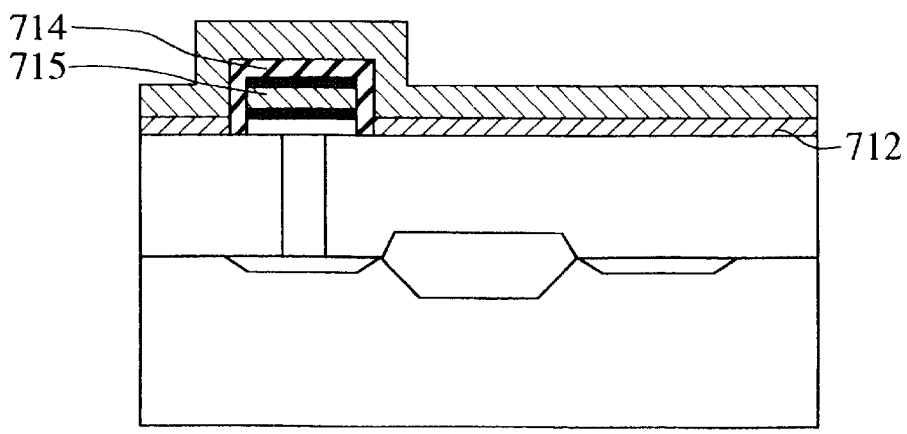

FIG. 7 consists of cross-sectional process drawings which serve to explain the fabricating method for a semiconductor device to which the fourth embodiment pertains.

(1) First of all, as in the above embodiments, a device isolation $SiO_2$ film 702 and a diffusion layer 703 are formed on the surface of a silicon wafer 701. Next, an interlayer insulating film 704 with a thickness of, for instance, 700–1000 nm is formed over the whole surface of the wafer 701 by CVD or a similar method. Following this, photolithography or another regular method is used to form a contact hole 705 in this film 704.

(2) The next step involves employing, for instance, sputtering to deposit polysilicon over the whole surface, after which an interlayer wiring film 706 is formed by means of etch-back (cf. FIG. 7(A)).

(3) Sputtering, CVD or a similar technique is then employed to form Ti, Ru and $RuO_2$ films in that order as in the third embodiment and to the same thickness. This is followed by a Ru film with a thickness of, for instance, 10 nm. By virtue of patterning by photolithography or another regular method these come to form a Ti barrier layer 707, a Ru metal film 708, a $RuO_2$ film 709 for use in supplying oxygen, and a Ru film 710.

Here it is preferable that the Ru film 708 be formed in such a manner that compressional stress is impressed on it, in the same way as in the third embodiment. On the other hand, it is preferable that the Ru film 710 be formed in such a manner that tensile stress is impressed on it (see below).

It should be added that the films 707–710 and the interlayer wiring film 706 constitute the bottom electrode 711.

(4) Following this, sputtering, CVD or a similar technique is employed again to form a TiN film 712 to a thickness of, for instance, 10–100 nm over the whole surface to form a film for use in forming an oxidized insulator film.

(5) Next, sputtering, CVD or a similar technique is employed once more to form a Ru film 713 to a thickness of, for instance, 50–200 nm to form a top electrode (cf. FIG. 7(B)).

(6) Finally, heat-treatment is implemented by rapid thermal anneal (RTA) or a similar method, for instance, for 3 min at 600° C. within an atmosphere not containing oxygen (e.g. an atmosphere of $N_2$, He, Ar, Xe or a similar gas). This causes the oxygen within the $RuO_2$ film 709 to be supplied to the TiN film 712, allowing an oxidized dielectric $TiO_2$ film 714 to be produced (cf. FIG. 7 (C)). At the same time, the $RuO_2$ film 709 loses its oxygen and becomes a Ru film 715.

In this embodiment, as explained above, the Ru film 708 is formed in such a manner that compressional stress is impressed on it. For this reason, as FIG. 4 shows, the Ru film 708 allows scarcely any oxygen to permeate. This makes it possible to prevent oxygen within the $RuO_2$ film 709 from reaching the films 706, 707 etc. below it, thus serving to inhibit oxidation of these films 706, 707 etc.

Meanwhile, in the present embodiment the Ru film 710 is formed in such a manner that tensile stress is impressed on it. This means that, as in the second embodiment, the catalytic properties of the Ru allow activated oxygen to be supplied to the TiN film 712.

Moreover, since the TiN film 712 is oxidized by means of oxygen which has been activated by the Ru film 710 as in the second embodiment, it is possible to ensure that the dielectric constant of the capacitor is high while current leakage is low, or to shorten the time required for heat-treatment.

Furthermore, the fact that the top electrode is formed of Ru from the start allows metal wiring and other subsequent processes to be effected with greater ease than in the above embodiments.

The present embodiment is the same as the above embodiments in that heat-treatment within an atmosphere which does not contain oxygen makes it possible to inhibit oxidation of the bottom electrode 711 and to prevent the formation of titanium silicide.

It is also the same as the above embodiments in that it is possible to use a TiN or Ti/TiN film as a barrier layer, Ir or Pt may be used as the metal film, and it is possible to use other nitrides such as TaN, ZrN and HfN in the film for use in the formation of an oxidized dielectric film. It is also possible to utilize an $IrO_2$ film, or one which consists of a mixture of $RuO_2$ and $IrO_2$, and to use a film with a different oxygen concentration.

Fifth Embodiment

Next, the fabricating method for the semiconductor device to which the fifth embodiment of the present invention pertains will be explained with reference to FIG. 8.

FIG. 8 consists of cross-sectional process drawings which serve to explain the fabricating method for a semiconductor device to which the fifth embodiment pertains.

(1) First of all, as in the above embodiments, a device isolation $SiO_2$ film 802 and a diffusion layer 803 are formed on the surface of a silicon wafer 801. Next, an interlayer insulating film 804 with a thickness of, for instance, 700–1000 nm is formed over the whole surface of the wafer 801 by CVD or a similar method. Following this, photolithography or another regular method is used to form a contact hole 805 in this film 804.

Figure 8A:
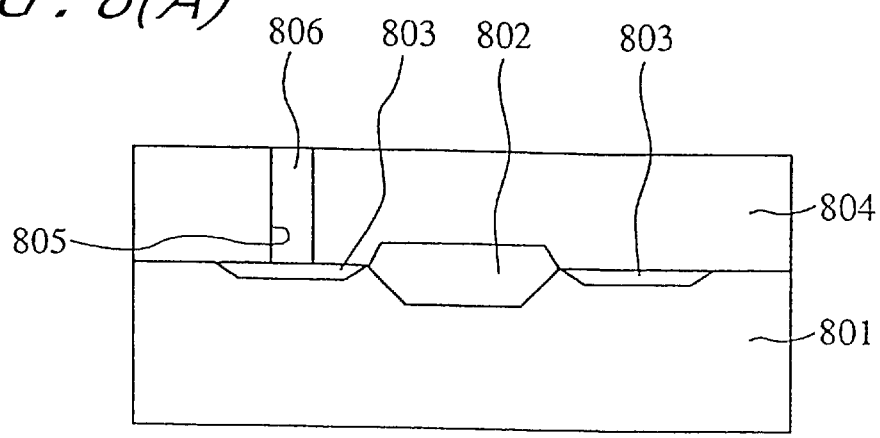
FIGS. 8(A)–8(C) consist of cross-sectional process drawings which serve to explain the fabricating method for a semiconductor device to which the fifth embodiment pertains.

(2) The next step involves employing, for instance, sputtering to deposit polysilicon over the whole surface, after which an interlayer wiring film 806 is formed by means of etch-back (cf. FIG. 8(A)).

(3) Sputtering, CVD or a similar technique is then employed to form Ti, Ru and $RuO_2$ films in that order as in the third embodiment and to the same thickness. By virtue of patterning by photolithography or another regular method these come to form a Ti barrier layer 807, a Ru metal film 808, and a $RuO_2$ film 809 for use in supplying oxygen.

Here it is preferable that the Ru film 808 be formed in such a manner that compressional stress is impressed on it, in the same way as in the third embodiment.

It should be added that the films 807–809 and the interlayer wiring film 806 constitute the bottom electrode 810.

(4) Following this, sputtering, CVD or a similar technique is employed again to form a TiN film 811 to a thickness of, for instance, 10–100 nm over the whole surface to form a film for use in forming an oxidized insulator film.

(5) Next, sputtering, CVD or a similar technique is employed once more to form a $RuO_2$ film 812 to a thickness of, for instance, 50–200 nm all over the TiN film 811 in order to form a film for use in supplying oxygen.

Figure 8B:
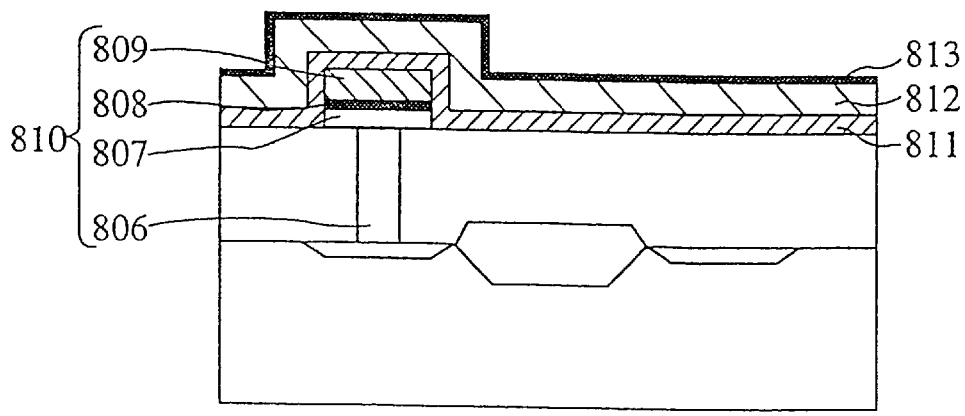
Figure 8C:
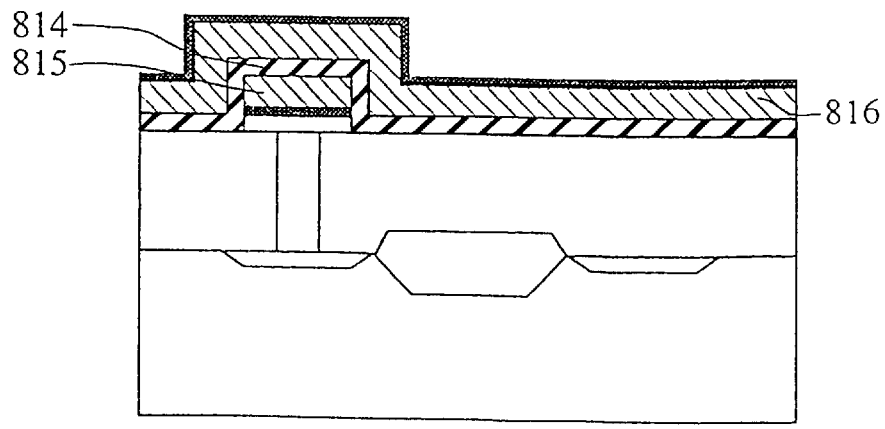

(6) Next, sputtering, CVD or a similar technique is employed yet again to form a Ru metal film 813 to a thickness of, for instance, 10–100 nm all over the $RuO_2$ film 812 (cf. FIG. 8(B)).

It should be added that it is preferable for this Ru film 813 to be formed in such a manner that compressional stress is impressed on it.

(7) Finally, heat-treatment is implemented by rapid thermal anneal (RTA) or a similar method, for instance, for 3 min at 600° C. within an atmosphere not containing oxygen (e.g. an atmosphere of $N_2$, He, Ar, Xe or a similar gas). This causes the oxygen within the $RuO_2$ films 809, 812 to be supplied to the TiN film 811, allowing an oxidized dielectric $TiO_2$ film 814 to be produced (cf. FIG. 8(C)). At the same time, the $RuO_2$ films 809, 812 lose their oxygen and become Ru films 815, 816.

In this embodiment, as explained above, the Ru film 808 is formed in such a manner that compressional stress is impressed on it. For this reason, as FIG. 4 shows, the Ru film 808 allows scarcely any oxygen to permeate, which makes it possible to inhibit oxidation of the Ti film 807 and the interlayer wiring film 806.

Similarly, the Ru film 813 is formed in such a manner that compressional stress is impressed on it. This allows the amount of oxygen which is dispersed outside the element from the $RuO_2$ film 809 (in an upward direction in FIG. 8(b)) to be reduced, while the amount of oxygen which contributes to the oxidation of the TiN film 811 is increased, thus improving the efficacy thereof.

Furthermore, the fact that the top electrode is formed of Ru from the start allows metal wiring and other subsequent processes to be effected with greater ease than in the above embodiments.

The present embodiment is the same as the above embodiments in that heat-treatment within an atmosphere which does not contain oxygen makes it possible to inhibit oxidation of the bottom electrode 810 and to prevent the formation of titanium silicide.

It is also the same as the above embodiments in that it is possible to use a TiN or Ti/TiN film as a barrier layer, Ir or Pt may be used as the metal film, and it is possible to use other nitrides such as TaN, ZrN and HfN in the film for use in the formation of an oxidized dielectric film. It is also possible to utilize an $IrO_2$ film, or one which consists of a mixture of $RuO_2$ and $IrO_2$, and to use a film with a different oxygen concentration.

Sixth Embodiment

Next, the fabricating method for the semiconductor device to which the sixth embodiment of the present invention pertains will be explained with reference to FIG. 9.

FIG. 9 consists of cross-sectional process drawings which serve to explain the fabricating method for a semiconductor device to which the sixth embodiment pertains.

(1) First of all, as in the above embodiments, a device isolation $SiO_2$ film 902 and a diffusion layer 903 are formed on the surface of a silicon wafer 901. Next, an interlayer insulating film 904 with a thickness of, for instance, 700–1000 nm is formed over the whole surface of the wafer 901 by CVD or a similar method. Following this, photolithography or another regular method is used to form a contact hole 905 in this film 904.

Figure 9A:
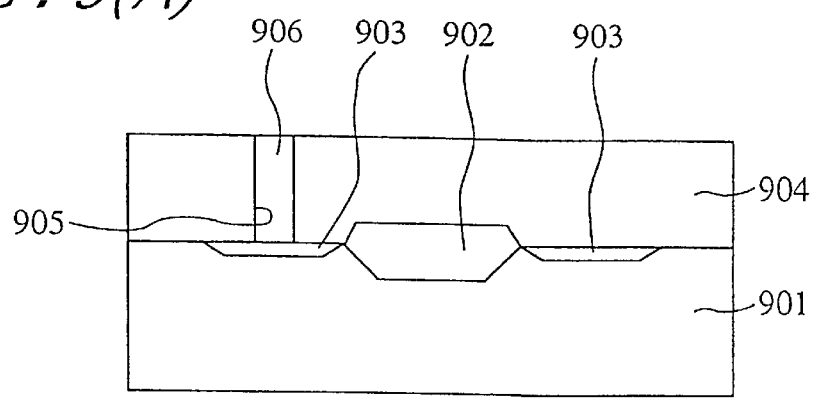
FIGS. 9(A)–9(C) consist of cross-sectional process drawings which serve to explain the fabricating method for a semiconductor device to which the sixth embodiment pertains.

(2) The next step involves employing, for instance, sputtering to deposit polysilicon over the whole surface, after which an interlayer wiring film 906 is formed by means of etch-back (cf. FIG. 9(A)).

(3) Sputtering, CVD or a similar technique is then employed to form Ti, Ru and $RuO_2$ films in that order as in the third embodiment and to the same thickness. By virtue of patterning by photolithography or another regular method these come to form a Ti barrier layer 907, a Ru metal film 908, and a $RuO_2$ film 909 for use in supplying oxygen.

Here it is preferable that the Ru film 908 be formed in such a manner that compressional stress is impressed on it, in the same way as in the third embodiment.

It should be added that the films 907–909 and the interlayer wiring film 906 constitute the bottom electrode 910.

(4) Following this, sputtering, CVD or a similar technique is employed again to form a TiN film 911 to a thickness of, for instance, 10–100 nm over the whole surface to form a film for use in forming an oxidized insulator film.

Figure 9B:
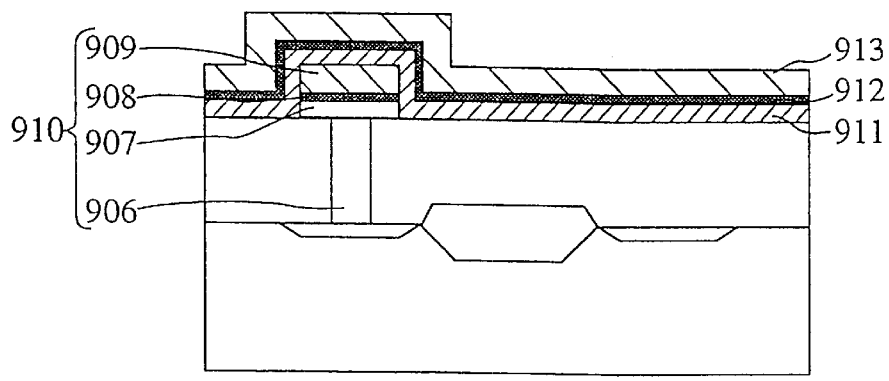
Figure 9C:
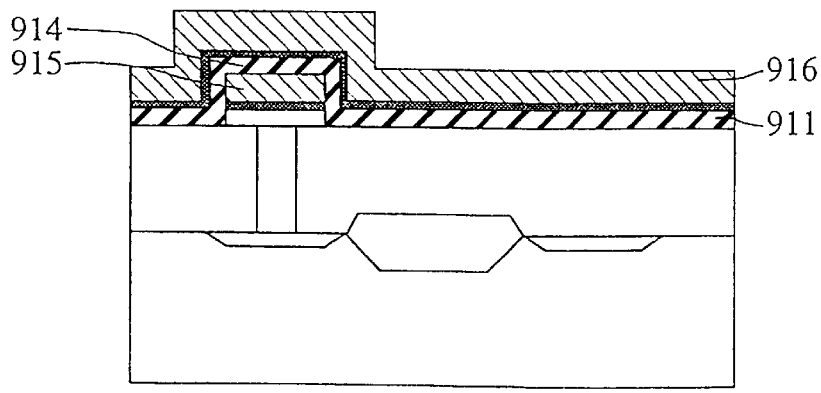

(5) Next, sputtering, CVD or a similar technique is employed once more to form a Ru metal film 912 to a thickness of, for instance, 10–100 nm all over the TiN film 911 (cf. FIG. 9(B)).

It should be added that it is preferable for this Ru film 912 to be formed in such a manner that tensile stress is impressed on it.

(6) Next, sputtering, CVD or a similar technique is employed yet again to form a $RuO_2$ film 913 to a thickness of, for instance, 50–200 nm all over the Ru film 912 in order to form a film for use in supplying oxygen.

(7) Finally, heat-treatment is implemented by rapid thermal anneal (RTA) or a similar method, for instance, for 3 min at 600° C. within an atmosphere not containing oxygen (e.g. an atmosphere of $N_2$, He, Ar, Xe or a similar gas). This causes the oxygen within the $RuO_2$ films 909, 913 to be supplied to the TiN film 911, allowing an oxidized dielectric $TiO_2$ film 914 to be produced (cf. FIG. 9(C)). At the same time, the $RuO_2$ films 909, 913 lose their oxygen to become Ru films 915, 916.

In this embodiment, as explained above, the Ru film 908 is formed in such a manner that compressional stress is impressed on it. For this reason, as FIG. 4 shows, the Ru film 908 allows scarcely any oxygen to permeate, which makes it possible to inhibit oxidation of the Ti film 907 and the interlayer wiring film 906.

Meanwhile, the Ru film 912 is formed in such a manner that tensile stress is impressed on it. For this reason it is able to activate oxygen supplied from the $RuO_2$ film 913 to the TiN film 911, thus making it possible, as in the second and fourth embodiments, to ensure that the dielectric constant of the capacitor is high while current leakage is low, or to shorten the time required for heat-treatment.

The present embodiment is the same as the above embodiments in that heat-treatment within an atmosphere which does not contain oxygen makes it possible to inhibit oxidation of the bottom electrode 910 and to prevent the formation of titanium silicide.

It is also the same as the above embodiments in that it is possible to use a TiN or Ti/TiN film as a barrier layer, Ir or Pt may be used as the metal film, and it is possible to use other nitrides such as TaN, ZrN and HfN in the film for use in the formation of an oxidized dielectric film. It is also possible to utilize an $IrO_2$ film, or one which consists of a mixture of $RuO_2$ and $IrO_2$, and to use a film with a different oxygen concentration.

Seventh Embodiment

Next, the fabricating method for the semiconductor device to which the seventh embodiment of the present invention pertains will be explained with reference to FIG. 10.

The present embodiment differs from the first embodiment in that tantalum oxide $Ta_2O_5$ films are used as the film for use in forming an oxidized dielectric film and as the oxidized dielectric film.

FIG. 10 consists of cross-sectional process drawings which serve to explain the fabricating method for a semiconductor device to which the seventh embodiment pertains.

(1) First of all, as in the first embodiment, a device isolation $SiO_2$ film 1002 and a diffusion layer 1003 which forms part of a MOS transistor or a similar device are formed on the surface of a silicon wafer 1001, an interlayer insulating film 1004 is formed over the whole surface of the wafer 1001, and a contact hole 1005 is formed in this film 1004.

Figure 10A:
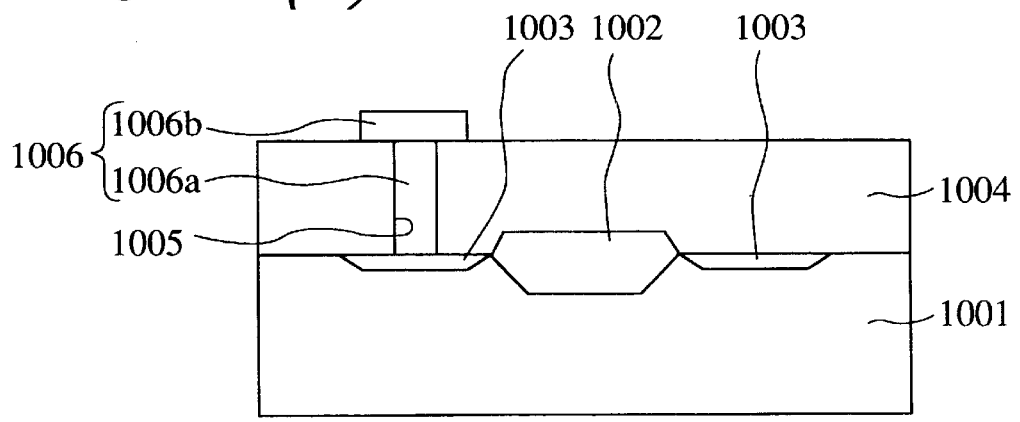
FIGS. 10(A)–10(C) consist of cross-sectional process drawings which serve to explain the fabricating method for a semiconductor device to which the seventh embodiment pertains.

(2) The next step involves employing, for instance, sputtering to deposit polysilicon to a thickness of, for instance, 20–100 nm over the whole surface, after which a bottom electrode 1006 having an interlayer wiring film 1006*a* and a conductive layer 1006*b* is formed by means of photolithography or another regular method (cf. FIG. 10(A)).

Figure 10B:
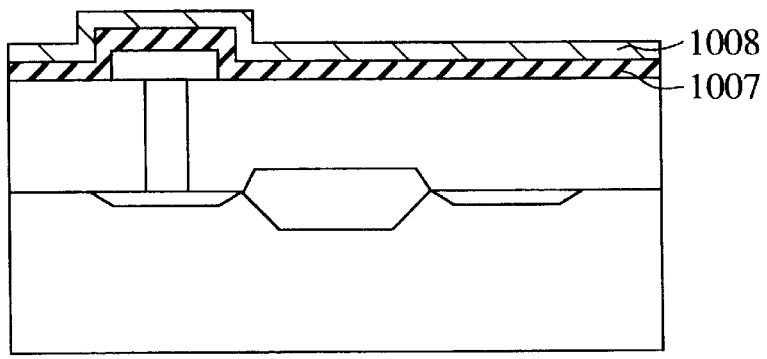

(3) Following this, CVD or a similar method is employed to form a $Ta_2O_5$ film 1007 with a thickness of, for instance, 5–30 nm for use in forming an oxidized dielectric film, as shown in FIG. 10(B). In this case, the crude gas used is $Ta(C_2H_6O)_5$, and the temperature at which the film is formed is for instance 350–500° C.

(4) Then, sputtering, CVD or a similar technique is employed to form a $RuO_2$ film 1008 to a thickness of, for instance, 50–200 nm over the whole surface of the $Ta_2O_5$ film 1007 in order to form a film for use in supplying oxygen.

Figure 10C:
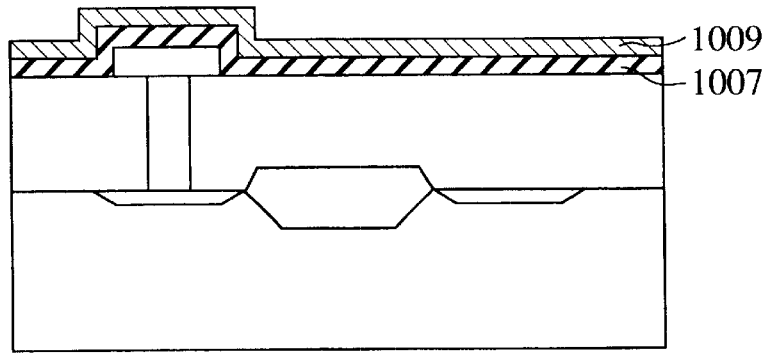

(5) Finally, heat-treatment is implemented by rapid thermal anneal (RTA) or a similar method, for instance, for 3 min at 600° C. within an atmosphere not containing oxygen (e.g. an atmosphere of $N_2$, He, Ar, Xe or a similar gas). This causes the oxygen within the $RuO_2$ film 1008 to be supplied to the $Ta_2O_5$ film 1007, allowing oxygen deficit to be compensated. At the same time, the $RuO_2$ film 1008 loses its oxygen to become a Ru film 1009 as illustrated in FIG. 10(C), which is used as the top electrode when the capacitor is completed.

Thus, the fabricating method for a semiconductor device to which the present embodiment pertains allows oxygen deficit in the $Ta_2O_5$ film 1007 to be compensated through heat-treatment within an atmosphere which does not contain oxygen.

The present embodiment is the same as the first embodiment in that the $RuO_2$ film 1008 has been employed as the film for use in supplying oxygen, but all that is required is that this film for use in supplying oxygen be an oxide conductor which is thermally less stable than the substance which forms the oxidized dielectric film, so that it is also possible to utilize an $IrO_2$ film, or one which consists of a mixture of $RuO_2$ and $IrO_2$. It is also possible to use a film with a different oxygen concentration.

Eighth Embodiment

Next, the fabricating method for the semiconductor device to which the eighth embodiment of the present invention pertains will be explained with reference to FIG. 11.

The present embodiment differs from the seventh embodiment in that oxygen is supplied from the upper and bottom electrode sides to a tantalum oxide $Ta_2O_5$ film for use in forming an oxidized dielectric film.

FIG. 11 consists of cross-sectional process drawings which serve to explain the fabricating method for a semiconductor device to which the eighth embodiment pertains.

(1) First of all, as in the above embodiments, a device isolation $SiO_2$ film 1102 and a diffusion layer 1103 are formed on the surface of a silicon wafer 1101, and an interlayer insulating film 1104 with a thickness of 700–1000 nm is formed by CVD or a similar method over the whole surface of the wafer 1101. A contact hole 1105 is then formed in the interlayer insulating film 1104 by means of photolithography or another regular method.

Figure 11A:
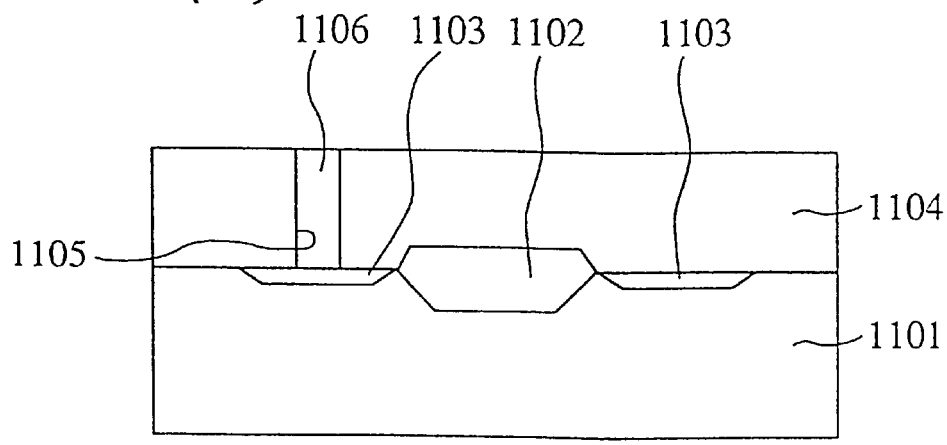
FIGS. 11(A)–11(C) consist of cross-sectional process drawings which serve to explain the fabricating method for a semiconductor device to which the eighth embodiment pertains.

(2) The next step involves employing, for instance, sputtering to deposit polysilicon over the whole surface, after which an interlayer wiring film 1106 is formed by means of etch-back (cf. FIG. 11(A)).

(3) Sputtering, CVD or a similar technique is then employed to form Ti, Ru and $RuO_2$ films in that order, which by virtue of patterning by photolithography or another regular method come to form a Ti barrier layer 1107, a Ru metal film 1108, and a $RuO_2$ film 1109 for use in supplying oxygen. The total thickness of these three films 1107–1109 may be for instance 50–150 nm, while that of the $RuO_2$ film 1109 may be for instance 20–100 nm.

Here it is preferable that the Ru film 1108 be formed in such a manner that compressional stress is impressed on it. This is in order to ensure that the Ru film 1108 is formed in such a manner as to allow oxygen to permeate only with difficulty, and to ensure that the Ti film 1107 and interlayer wiring film 1106 are not oxidized at a later stage when heat-treatment is implemented (cf. process 6).

(4) Then, sputtering, CVD or a similar technique is employed to form a $Ta_2O_5$ film 1110 to a thickness of, for instance, 10–100 nm over the whole surface in order to form a film for use in forming an oxidized insulating film.

Figure 11B:
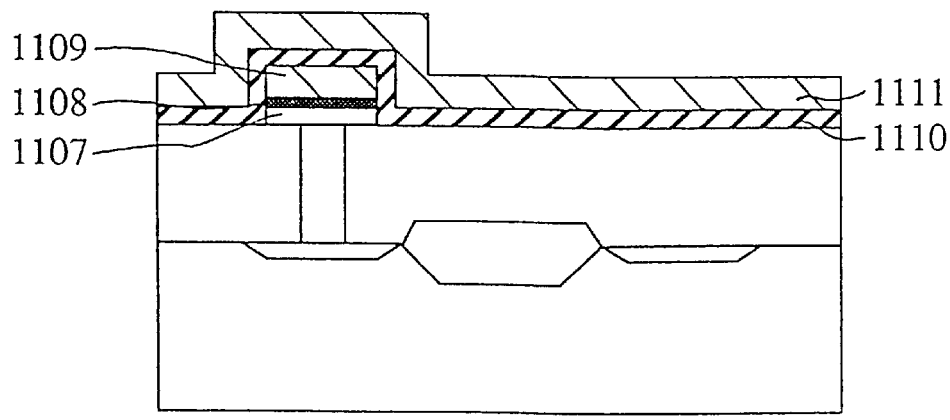
Figure 11C:
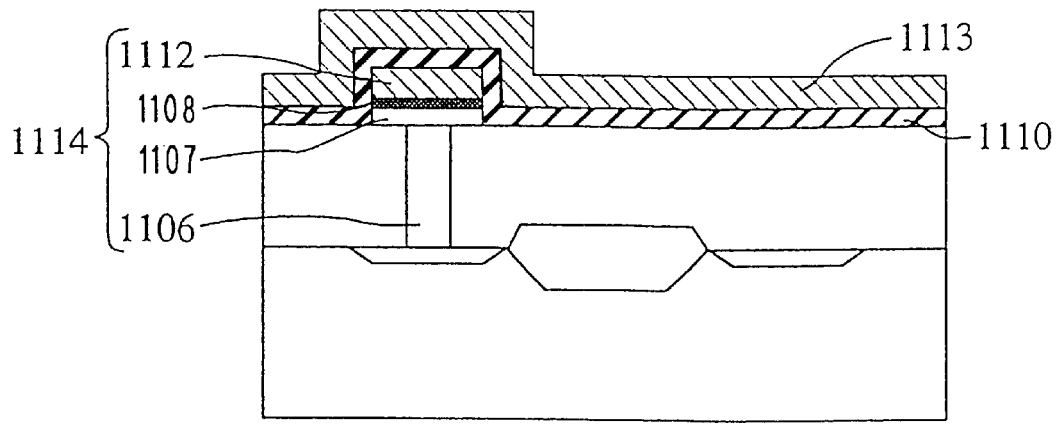

(5) Next, sputtering, CVD or a similar technique is again employed to form a $RuO_2$ film 1111 to a thickness of, for instance, 50–200 nm over the whole surface of the $Ta_2O_5$ film 1110 in order to form a film for use in supplying oxygen (cf. FIG. 11(B)).

(6) Finally, heat-treatment is implemented by rapid thermal anneal (RTA) or a similar method, for instance, for 3 min at 600° C. within an atmosphere not containing oxygen (e.g. an atmosphere of $N_2$, He, Ar, Xe or a similar gas). This causes the oxygen within the $RuO_2$ films 1109, 1111 to be supplied to the $Ta_2O_5$ film 1110, allowing oxygen deficit to be compensated. At the same time, the $RuO_2$ films 1109, 1111 lose their oxygen to become Ru films 1112, 1113. The Ru film 1112 forms the bottom electrode 1114 along with the Ti film 1107, the Ru film 1108 and the interlayer wiring film 1106 (cf. FIG. 11(C)), while the Ru film 1113 forms the top electrode (cf. FIG. 11(C)).

Thus, the fabricating method for a semiconductor device to which the present embodiment pertains also allows oxygen deficit in the $Ta_2O_5$ film 1110 to be compensated by virtue of heat-treatment within an atmosphere which does not contain oxygen. It is therefore possible to prevent increased current leakage in the capacitor without oxidation of the bottom electrode 1114 and other elements.

The fact that oxygen is supplied to the $Ta_2O_5$ film 1110 from the upper and bottom electrode 1113, 1114 sides means that it is possible to prevent the current leakage in the capacitor with an even greater degree of certainty than is the case in the seventh embodiment. Alternatively, it makes it possible to shorten the heat-treatment time if current leakage does not need to be better than that provided by the seventh embodiment.

In the present embodiment, the Ti film 1107 has been used as the barrier layer, but it is also possible to use a TiN or Ti/TiN film.

The present embodiment is also the same as the above embodiments in that all that is required of the film for use in supplying oxygen is that it be an oxide conductor which is thermally less stable than the substance which forms the oxidized dielectric film, so that it is also possible to utilize an $IrO_2$ film, or one which consists of a mixture of $RuO_2$ and $IrO_2$. Moreover, it is again possible to use a film with a different oxygen concentration.

Ninth Embodiment

Next, the fabricating method for the semiconductor device to which the ninth embodiment of the present invention pertains will be explained with reference to FIG. 12.

The present embodiment differs from the eighth embodiment in that activated oxygen is supplied to a tantalum oxide $Ta_2O_5$ film for use in forming an oxidized dielectric film.

FIG. 12 consists of cross-sectional process drawings which serve to explain the fabricating method for a semiconductor device to which the ninth embodiment pertains.

(1) First of all, as in the above embodiments, a device isolation $SiO_2$ film 1202 and a diffusion layer 1203 are formed on the surface of a silicon wafer 1201, and an interlayer insulating film 1204 with a thickness of 700–1000 nm is formed by CVD or a similar method over the whole surface of the wafer 1201. A contact hole 1205 is then formed in the interlayer insulating film 1204 by means of photolithography or another regular method.

Figure 12A:
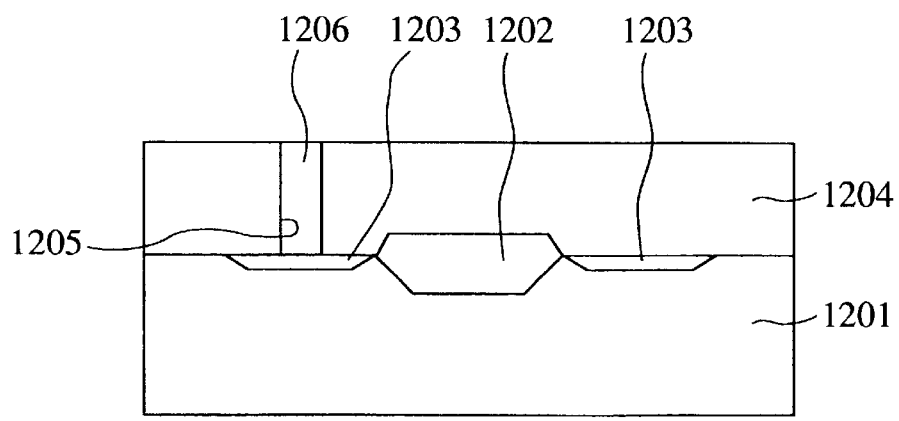
FIGS. 12(A)–12(C) consist of cross-sectional process drawings which serve to explain the fabricating method for a semiconductor device to which the ninth embodiment pertains.

(2) The next step involves employing, for instance, sputtering to deposit polysilicon over the whole surface, after which an interlayer wiring film 1206 is formed by means of etch-back (cf. FIG. 12(A)).

(3) Sputtering, CVD or a similar technique is then employed to form Ti, Ru, $RuO_2$ and Ru films in that order, which by virtue of patterning by photolithography or another regular method come to form a Ti barrier layer 1207, a Ru metal film 1208, a $RuO_2$ film 1209 for use in supplying oxygen, and a metal Ru film 1210. The total thickness of these three films 1207–1209 may be for instance 50–150 nm, while that of the $RuO_2$ film 1209 may be for instance 20–100 nm.

Here it is preferable that the Ru film 1208 be formed in such a manner that compressional stress is impressed on it. This is in order to ensure that the Ru film 1208 is formed in such a manner as to allow oxygen to permeate only with difficulty, and to ensure that the Ti film 1207 and interlayer wiring film 1206 are not oxidized at a later stage when heat-treatment is implemented (cf. process 7).

On the other hand, it is preferable that the Ru film 1210 be formed in such a manner that tensile stress is impressed on it. This is in order to ensure that the Ru film 1210 is formed in such a manner as to allow oxygen to permeate with ease, and to ensure that activated oxygen is obtained by allowing it to permeate the Ru film 1210.

(4) Then, sputtering, CVD or a similar technique is employed to form a $Ta_2O_5$ film 1211 to a thickness of, for instance, 10–100 nm over the whole surface in order to form a film for use in forming an oxidized insulating film.

(5) Next, sputtering, CVD or a similar technique is again employed to form a Ru film 1212 to a thickness of, for instance, 10 nm over the whole surface of the $Ta_2O_5$ film 1211 in order to form a metal film.

It is preferable that the Ru film 1212 also be formed in such a manner that tensile stress is impressed on it. This is in order to ensure that the Ru film 1212 is formed in such a manner as to allow oxygen to permeate with ease, and to ensure that activated oxygen is obtained by allowing i t to permeate the Ru film 1212.

Figure 12B:
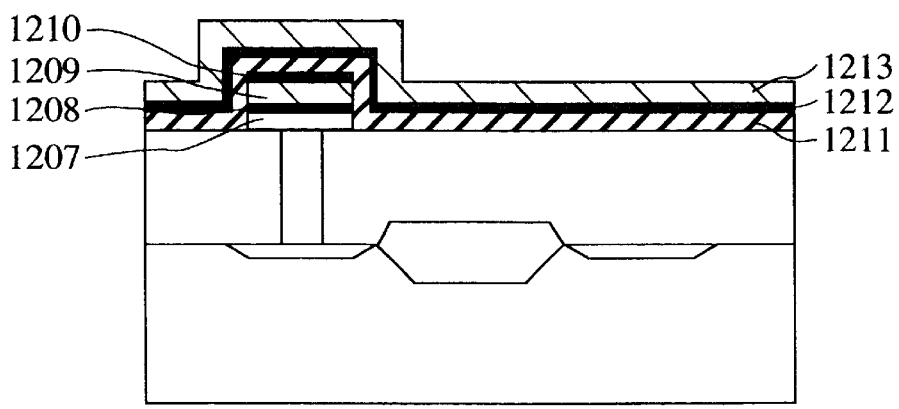
Figure 12C:
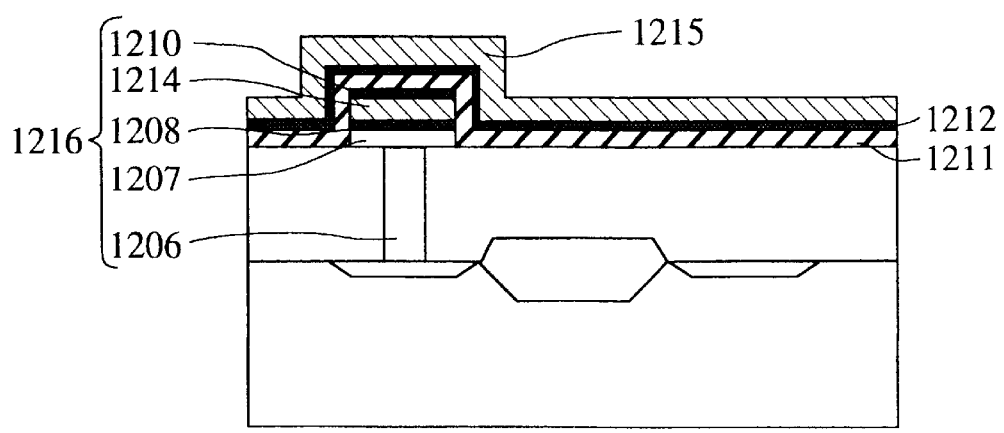

(6) Following this, sputtering, CVD or a similar technique is once more employed to form a $RuO_2$ film 1213 to a thickness of, for instance, 50–200 nm over the whole surface of the Ru film 1212 in order to form a film for use in supplying oxygen (cf. FIG. 12(B)).

(7) Finally, heat-treatment is implemented by rapid thermal anneal (RTA) or a similar method, for instance, for 3 min at 600° C. within an atmosphere not containing oxygen (e.g. an atmosphere of $N_2$, He, Ar, Xe or a similar gas). This causes the oxygen within the $RuO_2$ films 1209, 1213 to be supplied to the $Ta_2O_5$ film 1211, allowing oxygen deficit to be compensated. At the same time, the $RuO_2$ films 1209, 1213 lose their oxygen to become Ru films 1214, 1215. The Ru film 1214 forms the bottom electrode 1216 along with the Ti film 1207, the Ru films 1208, 1210 and the interlayer wiring film 1206 (cf. FIG. 12(C)), while the Ru film 1215 along with the Ru film 1212 forms the top electrode (cf. FIG. 12(C)).

Thus, the fabricating method for a semiconductor device to which the present embodiment pertains allows activated oxygen to be supplied to the $Ta_2O_5$ film 1211, making it possible to compensate current leakage even more effectively than in the case of the eighth embodiment.

In this manner, the fact that activated oxygen can be supplied to the $Ta_2O_5$ film 1211 in the fabricating method for a semiconductor device to which the present embodiment pertains makes it possible to compensate oxygen deficit even more effectively than in the case of the eighth embodiment.

In addition, Ru films 1210, 1212 have been used as metal films for activating oxygen, but it is also possible to use other materials such as iridium Ir and platinum Pt to form the metal films, provided that they have a catalytic action on oxygen.

The present embodiment is the same as the above embodiments in that a TiN or Ti/TiN film may be used as the barrier layer, and it is possible to use an $IrO_2$ film, or one which consists of a mixture of $RuO_2$ and $IrO_2$ as the layer for use in supplying oxygen. Moreover, it is again possible to use a film with a different oxygen concentration.

Tenth Embodiment

Next, the fabricating method for the semiconductor device to which the tenth embodiment of the present invention pertains will be explained with reference to FIG. 13.

The present embodiment differs from the first embodiment in that crystalline barium-strontium titanate (BST) films are used as the film for use in forming an oxidized dielectric film.

FIG. 13 consists of cross-sectional process drawings which serve to explain the fabricating method for a semiconductor device to which the tenth embodiment pertains.

(1) First of all, as in the first embodiment, a device isolation $SiO_2$ film 1302 and a diffusion layer 1303 forming part of a MOS transistor or a similar device are formed on the surface of a silicon wafer 1301, while a contact hole 1305 is formed in the interlayer insulating film 1304.

Figure 13A:
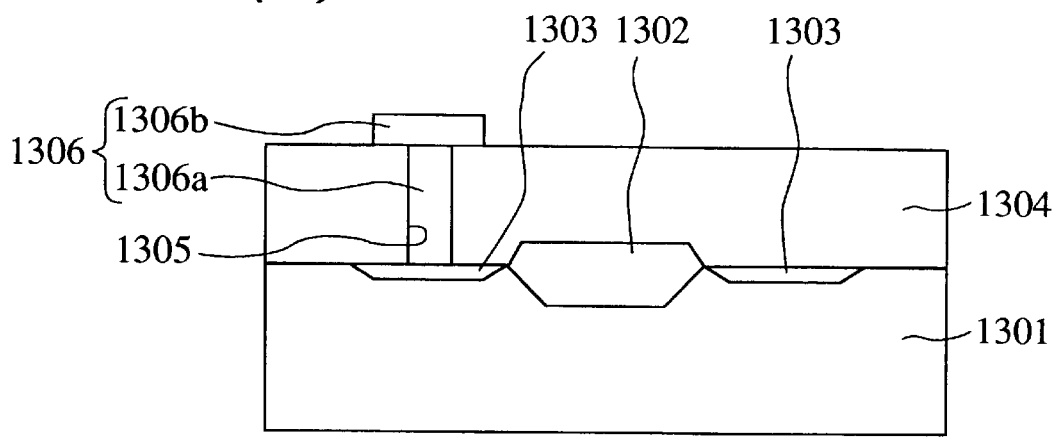
FIGS. 13(A)–13(C) consist of cross-sectional process drawings which serve to explain the fabricating method for a semiconductor device to which the tenth embodiment pertains.

(2) The next step involves employing, for instance, sputtering to deposit polysilicon over the whole surface to a thickness of 20–100 nm, after which a bottom electrode 1306 having an interlayer wiring film 1306*a* and a conductive layer 1306*b* is formed by means of photolithography or another regular method (cf. FIG. 13(A)).

(3) CVD or a similar method is then used to form a BST film 1307 with a thickness of, for instance, 5–30 nm for use in forming an oxidized dielectric film. The BST film 1307 comprises crystalline bodies of perovskite structure.

Figure 13B:
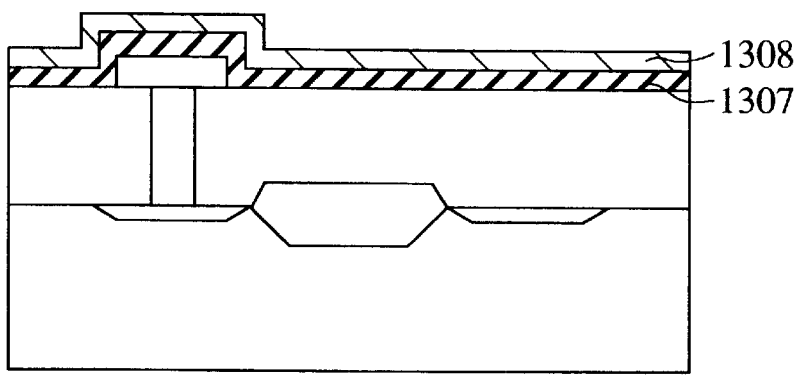
Figure 13C:
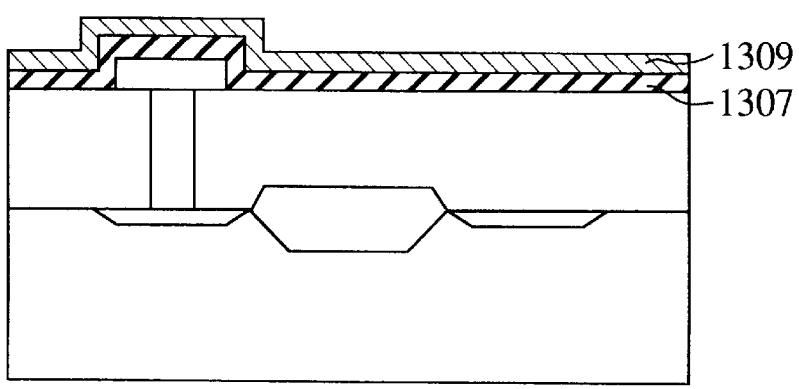

(4) Then, sputtering, CVD or a similar technique is employed to form a $RuO_2$ film 1308 to a thickness of, for instance, 50–200 nm over the whole surface of the BST layer 1307 as a film for use in supplying oxygen (cf. FIG. 13(B)).

(5) Finally, heat-treatment is implemented by rapid thermal anneal (RTA) or a similar method, for instance, for 3 min at 600° C. within an atmosphere not containing oxygen (e.g. an atmosphere of $N_2$, He, Ar, Xe or a similar gas). This causes the oxygen within the $RuO_2$ film 1308 to be supplied to the BST film 1307, allowing oxygen deficit to be compensated. At the same time, the $RuO_2$ film 1308 loses its oxygen to become Ru film 1309, forming the top electrode in the completed capacitor (cf. FIG. 13(C)).

Thus, by supplying oxygen to the BST film 1307 through heat-treatment within an atmosphere which does not contain oxygen, the fabricating method for a semiconductor device to which the present embodiment pertains makes it possible for oxygen deficit in the BST film 1307 to be compensated without oxidizing the polysilicon or other elements.

Here, the $RuO_2$ film 1308 has been employed as the film for use in supplying oxygen, but all that is required is that this film for use in supplying oxygen be an oxide conductor which is thermally less stable than the substance which forms the oxidized dielectric film, and it is also possible to utilize an $IrO_2$ film, or one which consists of a mixture of $RuO_2$ and $IrO_2$. Moreover, it is possible to use a film with a different oxygen concentration.

In addition, it is also possible to provide metal films formed from Ru, Ir, Pt or similar metals as at least one of the upper or bottom electrodes in order to activate the oxygen supplied to the BST film 1307.

Eleventh Embodiment

Next, the fabricating method for the semiconductor device to which the eleventh embodiment of the present invention pertains will be explained with reference to FIG. 14.

The present embodiment differs from the tenth embodiment in that a non-crystalline BST film is used as the film for use in forming an oxidized dielectric film.

FIG. 14 consists of cross-sectional process drawings which serve to explain the fabricating method for a semiconductor device to which the eleventh embodiment pertains.

(1) First of all, as in the first embodiment, a device isolation $SiO_2$ film 1402 and a diffusion layer 1403 forming part of a MOS transistor or a similar device are formed on the surface of a silicon wafer 1401, while a contact hole 1405 is formed in the interlayer insulating film 1404.

Figure 14A:
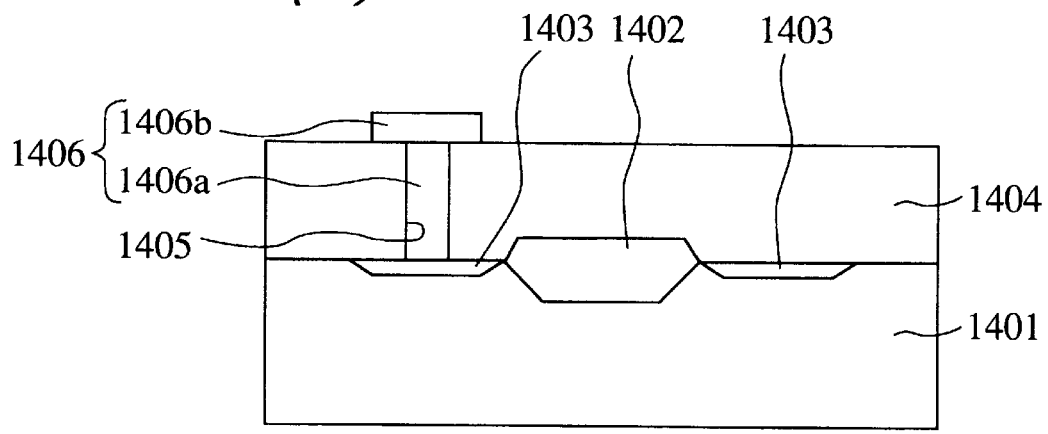
FIGS. 14(A)–14(C) consist of cross-sectional process drawings which serve to explain the fabricating method for a semiconductor device to which the eleventh embodiment pertains.

(2) The next step involves employing, for instance, sputtering to deposit polysilicon over the whole surface to a thickness of 20–100 nm, after which a bottom electrode 1406 having an interlayer wiring film 1406*a* and a conductive layer 1406*b* is formed by means of photolithography or another regular method (cf. FIG. 14(A)).

(3) CVD or a similar method at 400° C. or below is then used to form a non-crystalline BST film 1407 with a thickness of, for instance, 5–30 nm for use in forming an oxidized dielectric film.

Figure 14B:
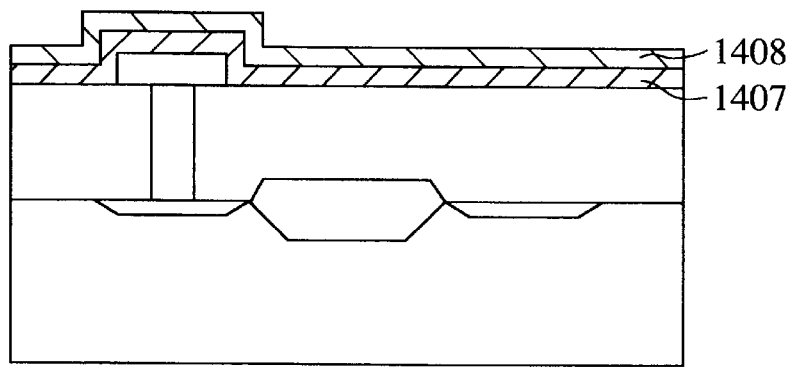
Figure 14C:
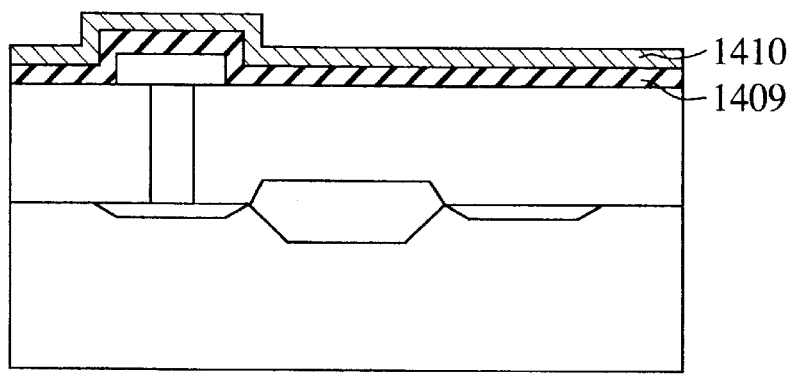

(4) Then, sputtering, CVD or a similar technique is employed to form a $RuO_2$ film 1408 to a thickness of, for instance, 50–200 nm over the whole surface of the BST layer 1407 as a film for use in supplying oxygen (cf. FIG. 14(B)).

(5) Finally, heat-treatment is implemented by rapid thermal anneal (RTA) or a similar method, for instance, for 3 min at 500° C. within an atmosphere not containing oxygen (e.g. an atmosphere of $N_2$, He, Ar, Xe or a similar gas). This causes the BST film 1407 to crystallize, thus fabricating a BST film 1409 comprising crystalline bodies of perovskite structure as an oxidized dielectric film. At the same time, the $RuO_2$ film 1408 loses its oxygen to become a Ru film 1410, forming the top electrode in the completed capacitor (cf. FIG. 14(C)).

Thus, in the fabricating method for a semiconductor device to which the present embodiment pertains, a non-crystalline BST film 1407 is formed first for use in forming an oxidized dielectric film (process 3). As a result, the BST is non-crystalline and the dielectric constant is low when the $RuO_2$ film 1408 is formed (process 4). This makes it possible to inhibit the occurrence of localized insulation breakdown (e.g. breakdown of the gate oxidation film) in the semiconductor device resulting from charge-up of the BST film 1407 during formation of the $RuO_2$ film 1408. The fact that the BST film 1407 crystallizes during the subsequent heat-treatment process (process 5) makes it possible to form an oxidized dielectric film (BST film 1409) with a sufficiently high dielectric constant. In other words, the present embodiment serves to prevent insulation breakdown during the formation of the $RuO_2$ film 1408, thus improving the yield of the semiconductor device.

The present embodiment is the same as the tenth embodiment in that by supplying oxygen to the BST film 1407 through heat-treatment within an atmosphere which does not contain oxygen, it makes it possible for oxygen deficit in the BST film 1407 to be compensated without oxidizing the polysilicon or other elements.

Here, the $RuO_2$ film 1408 has been employed as the film for use in supplying oxygen, but all that is required is that this film for use in supplying oxygen be an oxide conductor which is thermally less stable than the substance which forms the oxidized dielectric film, and it is also possible to utilize an $IrO_2$ film, or one which consists of a mixture of $RuO_2$ and $IrO_2$. Moreover, it is possible to use a film with a different oxygen concentration.

In addition, it is also possible to provide metal films formed from Ru, Ir, Pt or similar metals as at least one of the upper or bottom electrodes in order to activate the oxygen supplied to the BST film 1407.

Twelfth Embodiment

Next, the fabricating method for the semiconductor device to which the twelfth embodiment of the present invention pertains will be explained with reference to FIG. 15.

The present embodiment differs from the first and tenth embodiments in that lead zirconate titanate (PZT) films are used as the film for use in forming an oxidized dielectric film.

FIG. 15 consists of cross-sectional process drawings which serve to explain the fabricating method for a semiconductor device to which the twelfth embodiment pertains.

(1) First of all, as in the first embodiment, a device isolation $SiO_2$ film 1502 and a diffusion layer 1503 forming part of a MOS transistor or a similar device are formed on the surface of a silicon wafer 1501, while a contact hole 1505 is formed in the interlayer insulating film 1504.

Figure 15A:
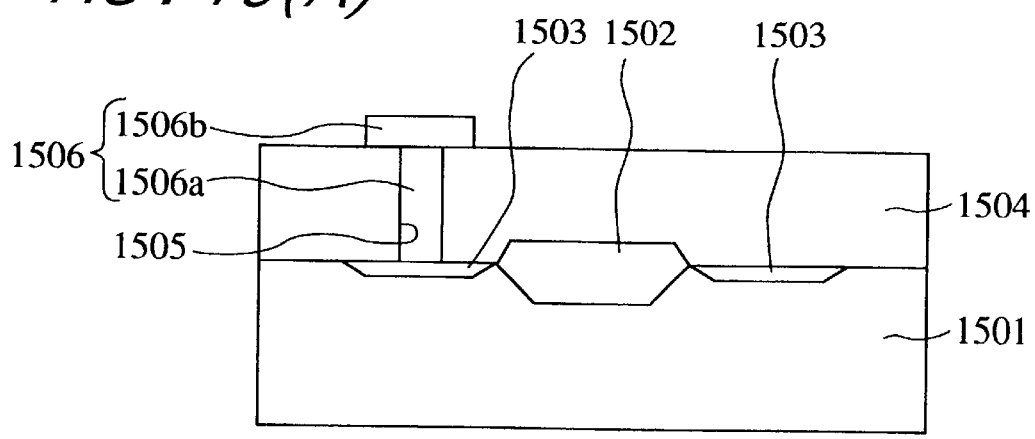
FIGS. 15(A)–15(C) consist of cross-sectional process drawings which serve to explain the fabricating method for a semiconductor device to which the twelfth embodiment pertains.

(2) The next step involves employing, for instance, sputtering to deposit polysilicon over the whole surface to a thickness of 20–100 nm, after which a bottom electrode 1506 having an interlayer wiring film 1506a and a conductive layer 1506b is formed by means of photolithography or another regular method (cf. FIG. 15(A)).

(3) The reactive sputter method, Sol-Gel method or a similar method is then used to form a pyrochlore phase or non-crystalline PZT film 1507 with a thickness of, for instance, 5–30 nm for use in forming an oxidized dielectric film.

Here, the conditions for forming the PZT film 1507 are as follows. With the reactive sputter method, the temperature at which the film is formed is, for instance, 200–400° C., the $Ar/O_2$ flow ratio 9–0.1, the pressure 1 mTorr–0.1 mTorr, and the target a sintered or metallic target. In the case of the Sol-Gel method, the conditions are, for instance, an alkoxide solution of lead, titanium and zirconium, a baking temperature of 200–400° C., and an atmosphere containing oxygen.

Figure 15B:
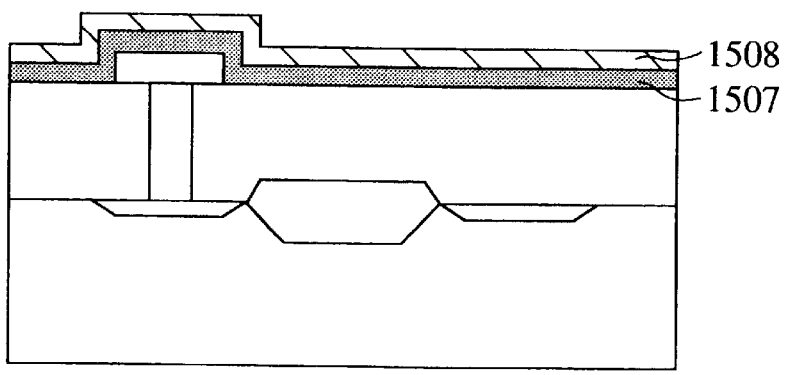
Figure 15C:
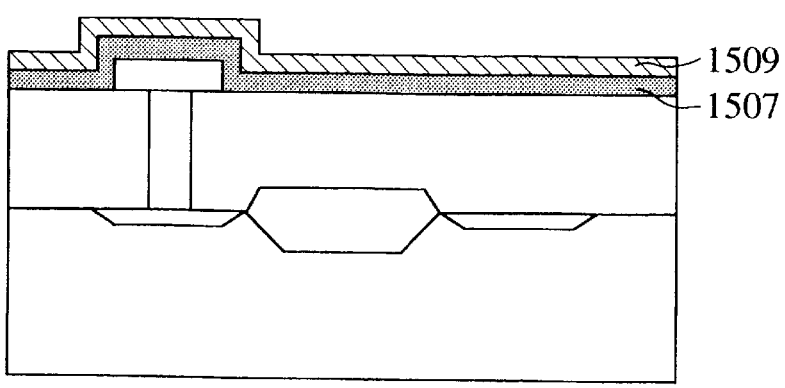
Figure 16:
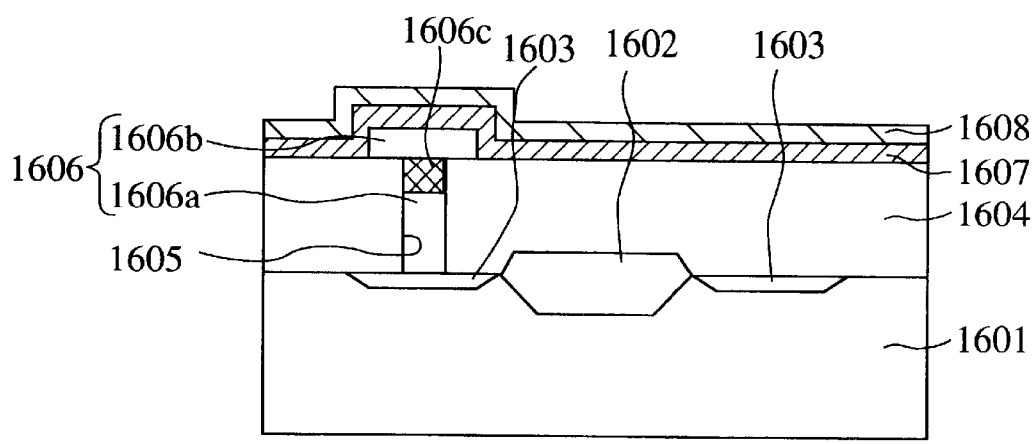
FIG. 16 is a cross-section illustrating an example of the configuration of a conventional semiconductor device.

(4) Then, sputtering, CVD or a similar technique is employed to form a $RuO_2$ film 1508 to a thickness of, for instance, 50–200 nm over the whole surface of the PZT film 1507 as a film for use in supplying oxygen (cf. FIG. 15(B)).

(5) Finally, heat-treatment is implemented by rapid thermal anneal (RTA) or a similar method, for instance, for 3 min at 600° C. within an atmosphere not containing oxygen (e.g. an atmosphere of $N_2$, He, Ar, Xe or a similar gas). This causes the oxygen within the $RuO_2$ film 1508 to be supplied to the PZT film 1507, thus compensating oxygen deficit. At the same time, the $RuO_2$ film 1508 loses its oxygen to become Ru film 1509, which is used as the top electrode in the completed capacitor (cf. FIG. 15(C)).

Thus, by supplying oxygen to the PZT film 1507 through heat-treatment within an atmosphere which does not contain oxygen, the fabricating method for a semiconductor device to which the present embodiment pertains makes it possible for oxygen deficit in the PZT film 1507 to be compensated without oxidizing the polysilicon or other elements.

The present embodiment is the same as the tenth embodiment in that by supplying oxygen to the BST film 1507 through heat-treatment within an atmosphere which does not contain oxygen, it makes it possible for oxygen deficit in the BST film 1507 to be compensated without oxidizing the polysilicon or other elements.

Here, the $RuO_2$ film 1508 has been employed as the film for use in supplying oxygen, but all that is required is that this film for use in supplying oxygen be an oxide conductor which is thermally less stable than the substance which forms the oxidized dielectric film, and it is also possible to utilize an $IrO_2$ film, or one which consists of a mixture of $RuO_2$ and $IrO_2$. Moreover, it is possible to use a film with a different oxygen concentration as in the first embodiment.

In addition, it is also possible to provide metal films formed from Ru, Ir, Pt or similar metals as at least one of the upper or bottom electrodes in order to activate the oxygen supplied to the PZT film 1507.

As has been explained in detail above, the fabricating method for a semiconductor device to which the present invention pertains makes it possible to form an oxidized dielectric film or to compensate oxygen deficit in a formed oxidized dielectric film by means of heat-treatment in an atmosphere which does not contain oxygen, thus making it possible to improve the yield of the semiconductor device without oxidizing the polysilicon or other elements.

What is claimed is:

1. A fabrication method for a semiconductor device, comprising:

forming a laminated structure, having at least a first film for use in forming an oxidized dielectric film and which contains an oxidizable substance for the purpose of forming an oxidized dielectric film, and having a second film for use in supplying oxygen to the first film, and supplying oxygen from the second film to the first film by virtue of heat-treatment of the laminated structure within an atmosphere which does not contain oxygen.

2. The fabrication method for a semiconductor device according to claim 1, wherein said supplying oxygen comprises:

forming the oxidized dielectric film by nitriding the oxidizable substance in the first film.

3. The fabrication method for a semiconductor device according to claim 1, wherein the first film has a same composition as the oxidized dielectric film, said supplying oxygen comprising compensating an oxygen deficit in the first film by virtue of the heat-treatment of the laminated structure within the atmosphere which does not contain oxygen.

4. The fabrication method for a semiconductor device according to claim 1, wherein the second film constitutes a part of, or all of, a top electrode of a capacitor.

5. The fabrication method for a semiconductor device according to claim 4, wherein the top electrode is further provided with a metal film for activating the oxygen which is supplied from the second film to the first film.

6. The fabrication method for a semiconductor device according to claim 1, wherein the second film constitutes part of, or all of, a bottom electrode of a capacitor.

7. The fabrication method for a semiconductor device according to claim 6, wherein the bottom electrode is provided with an interlayer wiring film formed within a through hole, a barrier layer formed on the interlayer wiring film, a metal film that is compression stressed formed on the barrier layer, and the second film for use in supplying oxygen formed on the metal film.

8. The fabrication method for a semiconductor device according to claim 6, wherein the bottom electrode is provided with an interlayer wiring film formed within a through-hole, a barrier layer formed on the interlayer wiring film, a first metal film that is compression stressed formed on the barrier layer, the second film for use in supplying oxygen formed on the first metal film, and a second metal film this is tensile stressed formed on the second film.

9. The fabrication method for a semiconductor device according to claim 1, wherein said forming a laminated structure comprises:

forming the second film which constitutes part of, or all of, a bottom electrode of a capacitor; and forming a third film for use in supplying oxygen to the first film, the third film constitutes part of, or all of, a top electrode of the capacitor.

10. The fabrication method for a semiconductor device according to claim 9, wherein the bottom electrode is provided with an interlayer wiring film formed within a through hole, a barrier layer formed on the interlayer wiring film, a first metal film that is compression stressed formed on the barrier layer, and the second film formed on the first metal film, and the top electrode is provided with the third film formed on the first film, and a second metal film that is compression stressed formed on the third film.

11. The fabrication method for a semiconductor device according to claim 10, wherein the bottom electrode is further provided with a third metal film for activating the oxygen which is supplied from the second film.

12. The fabrication method for a semiconductor device according to claim 10, wherein the top electrode is further provided with a third metal film for activating the oxygen which is supplied from the second film.

13. The fabrication method for a semiconductor device according to claim 2, wherein the first film is a titanium nitride film, a tantalum nitride film, a zirconium nitride film or a hafnium nitride film.

14. The fabrication method for a semiconductor device according to claim 3, wherein the first film is a tantalum oxide film or a lead zirconate titanate film.

15. The fabrication method for a semiconductor device according to claim 3, wherein the first film is an amorphous barium-strontium titanate film or a lead zirconate titanate film, and the oxidized dielectric film is a barium-strontium titanate film or a lead zirconate titanate film which has been crystallized during said supplying oxygen.

16. The fabrication method for a semiconductor device according to claim 1, wherein the second film is a ruthenium oxide film, an iridium oxide film, or a film consisting of a mixture of a ruthenium oxide film and an iridium oxide film.

17. The fabrication method for a semiconductor device according to claim 5, wherein the metal film is formed of either ruthenium, iridium or platinum.

18. The fabrication method for a semiconductor device according to claim 8, wherein the first and second metal films are formed of either ruthenium, iridium or platinum.

19. The fabrication method for a semiconductor device according to claim 10, wherein the first and second metal films are formed of either ruthenium, iridium or platinum.

20. A method of fabricating a semiconductor device, comprising:

forming a first electrode on a semiconductor substrate;

forming a first film which includes an oxidizable substance, on the first electrode;

forming a second film which includes oxygen, on the first film; and supplying oxygen from the second film to the first film by heating in an inert gas.

21. The method of fabricating a semiconductor device according to claim 20, further comprising forming a first metal film on the first film which activates the oxygen of the second film, the second film being formed on the first metal film.

22. The method of fabricating a semiconductor device according to claim 20, wherein said forming a first electrode includes:

forming a barrier film on the semiconductor substrate;

forming a metal film on the barrier film which prevents oxidation of the barrier film; and forming a third film which includes oxygen, on the metal film, the first film being oxidized during said supplying oxygen by the oxygen included in the second film and the third film.

23. The method of fabricating a semiconductor device according to claim 22, further comprising forming on the third film a second metal film which activates the oxygen.

24. The method of fabricating a semiconductor device according to claim 22, further comprising forming a second metal film on the first film which activates the oxygen of the second film.

25. A method of fabricating a semiconductor device, comprising;

forming a laminated structure which includes a first film, and a second film comprising oxygen; and supplying the oxygen from the second film to the first film by heating within an inert gas.

26. A method of fabricating a semiconductor device, comprising;

forming a laminate structure which includes a first film on a semiconductor substrate and a second film, the first film includes an oxidizable substructure, and the second film includes oxygen; and supplying the oxygen from the second film to the first film by heating within an inert gas.

27. The method of fabricating a semiconductor device according to claim 26, further comprising forming a first metal layer which activates the oxygen, between the first film and the second film.

* * * * *